(12) United States Patent
Kim et al.

(10) Patent No.: US 10,320,408 B2
(45) Date of Patent: Jun. 11, 2019

(54) ELECTRONIC CIRCUIT PERFORMING GAIN CONTROL AND GAIN COMPRESSION TO IMPROVE CHARACTERISTIC OF ANALOG OUTPUT AND ELECTRONIC DEVICE INCLUDING THE SAME

(71) Applicant: Samsung Electronics Co., Ltd., Suwon-si, Gyeonggi-do (KR)

(72) Inventors: Young-Hun Kim, Seongnam-si (KR); Yunseob Song, Yongin-si (KR); Jonghwa Won, Bucheon-si (KR); Wangseup Yeum, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/862,794

(22) Filed: Jan. 5, 2018

(65) Prior Publication Data

US 2018/0367158 A1 Dec. 20, 2018

(30) Foreign Application Priority Data

Jun. 19, 2017 (KR) ........................ 10-2017-0077429

(51) Int. Cl.
| | |
|---|---|
| *H03K 5/153* | (2006.01) |
| *H03M 1/18* | (2006.01) |
| *H03K 5/003* | (2006.01) |
| *G01R 19/04* | (2006.01) |
| *H03G 3/30* | (2006.01) |
| *H03G 7/08* | (2006.01) |
| *H03K 5/1532* | (2006.01) |
| *G01R 35/00* | (2006.01) |

(52) U.S. Cl.
CPC ............ *H03M 1/185* (2013.01); *G01R 19/04* (2013.01); *G01R 35/005* (2013.01); *H03G 3/3078* (2013.01); *H03G 7/08* (2013.01); *H03K 5/003* (2013.01); *H03K 5/1532* (2013.01)

(58) Field of Classification Search
CPC ........ H03G 7/002; H03G 7/007; H01B 11/00; H01B 11/02
See application file for complete search history.

(56) References Cited

U.S. PATENT DOCUMENTS

| | | |
|---|---|---|
| 7,630,887 B2 | 12/2009 | Erell |
| 7,742,746 B2 | 6/2010 | Xiang et al. |
| 8,362,936 B2 | 1/2013 | Ledzius et al. |
| 8,717,211 B2 | 5/2014 | Miao et al. |
| 9,065,413 B2 | 6/2015 | Pereira et al. |

(Continued)

*Primary Examiner* — Sibin Chen
(74) *Attorney, Agent, or Firm* — Harness, Dickey & Pierce, P.L.C.

(57) ABSTRACT

An electronic circuit includes a peak detector, a gain controller, and a compressor. The peak detector detects a peak level from a digital input. The gain controller outputs a digital gain with regard to increasing the peak level to a target level, The compressor provides the gain controller with a compressed gain which is to be output as the digital gain, based on the detected peak level. In a compression interval where the peak level is greater than a threshold level, the output digital gain increases as the peak level decreases. The compressor generates the compressed gain such that a ratio of an increment of the output digital gain to a decrement of the peak level in the compression interval is less than a reference ratio.

20 Claims, 26 Drawing Sheets

(56) References Cited

U.S. PATENT DOCUMENTS

| | | |
|---|---|---|
| 9,425,747 B2 | 8/2016 | Bazarjani et al. |
| 9,515,626 B2 | 12/2016 | Lesso |
| 2013/0103396 A1* | 4/2013 | Swanson ............... H03G 7/002 704/225 |
| 2015/0207479 A1 | 7/2015 | Baumgarte |

* cited by examiner

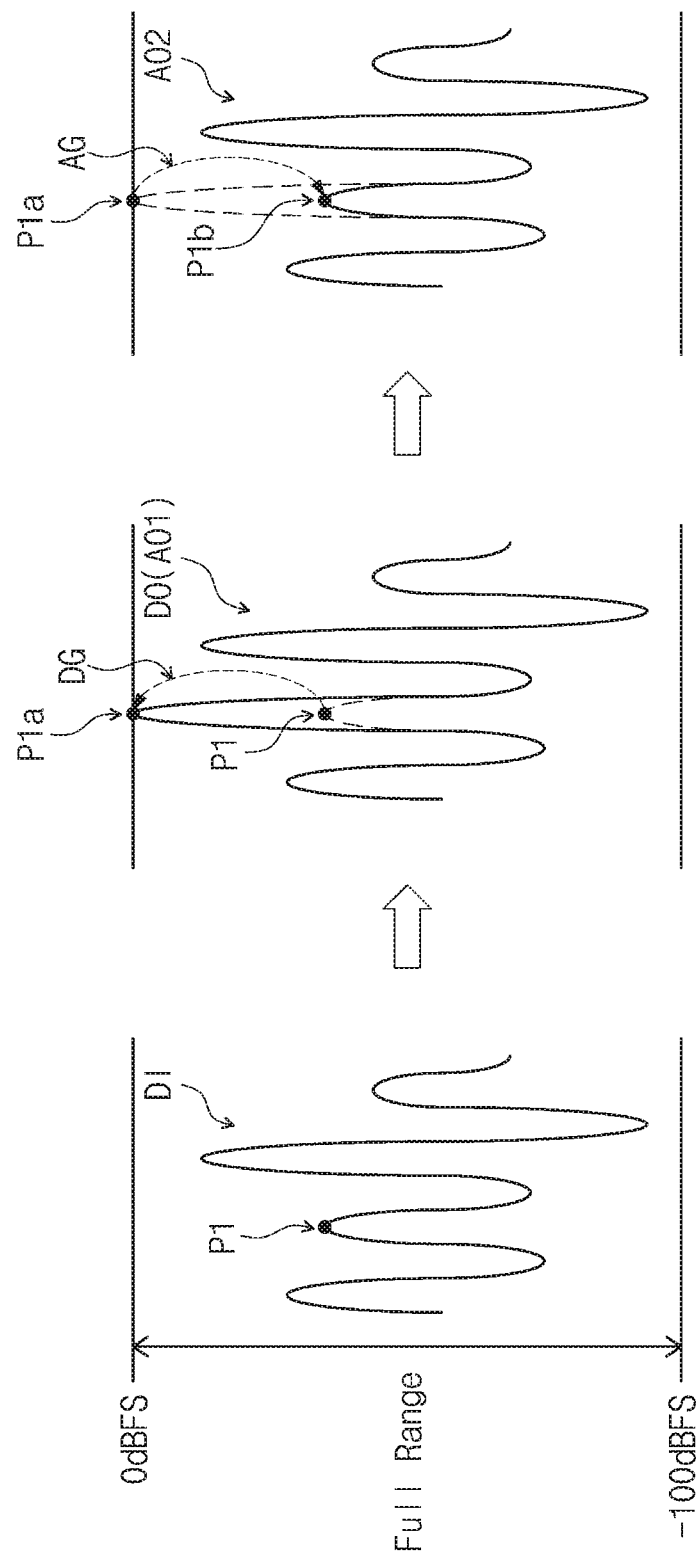

| dBFS of DI | DG | dBFS of DO | AG | dBV of AO2 |
|---|---|---|---|---|
| 0 | 0 | 0 | 0 | 0 |
| −10 | +10 | 0 | −10 | −10 |
| −20 | +20 | 0 | −20 | −20 |
| −30 | +30 | 0 | −30 | −30 |
| −40 | +40 | 0 | −40 | −40 |
| −50 | +50 | 0 | −50 | −50 |
| −60 | +60 | 0 | −60 | −60 |

Threshold Level = -40dBFS
Compression Ratio = 2:1

| dBFS of DI | DG | dBFS of DO | AG | dBV of AO2 |
|---|---|---|---|---|
| 0 | 0 | 0 | 0 | 0 |
| -10 | +5 | -5 | -5 | -10 |
| -20 | +10 | -10 | -10 | -20 |
| -30 | +15 | -15 | -15 | -30 |
| -40 | +20 | -20 | -20 | -40 |
| -50 | +30 | -20 | -30 | -50 |
| -60 | +40 | -20 | -40 | -60 |

Threshold Level = −46dBFS
Compression Ratio = 2:1

| dBFS of DI | DG | dBFS of DO | AG | dBV of AO2 |
|---|---|---|---|---|
| 0 | 0 | 0 | 0 | 0 |
| −6 | 0 | −6 | 0 | −6 |
| −16 | +5 | −11 | −5 | −16 |
| −26 | +10 | −16 | −10 | −26 |
| −36 | +15 | −21 | −15 | −36 |
| −46 | +20 | −26 | −20 | −46 |
| −56 | +30 | −26 | −30 | −56 |
| −66 | +40 | −26 | −40 | −66 |

Reference Level = -20dBFS
Reference Gain = 20dBFS

| dBFS of DI | DG | dBFS of DO | AG | dBV of AO2 |
|---|---|---|---|---|
| 0 | 0 | 0 | 0 | 0 |
| -10 | +10 | 0 | -10 | -10 |
| -20 | +20 | 0 | -20 | -20 |
| -30 | +20 | -10 | -20 | -30 |
| -40 | +20 | -20 | -20 | -40 |
| -50 | +20 | -30 | -20 | -50 |
| -60 | +20 | -40 | -20 | -60 |

FIG. 15A

Threshold Level = -46 dBFS
Compression Ratio = 2:1
Reference Gain = 20 dBFS

| dBFS of DI | DG | dBFS of DO | AG | dBV of AO2 |
|---|---|---|---|---|
| 0 | 0 | 0 | 0 | 0 |
| -6 | 0 | -6 | 0 | -6 |
| -16 | +5 | -11 | -5 | -16 |
| -26 | +10 | -16 | -10 | -26 |
| -36 | +15 | -21 | -15 | -36 |
| -46 | +20 | -26 | -20 | -46 |
| -50 | +20 | -30 | -20 | -50 |
| -60 | +20 | -40 | -20 | -60 |

FIG. 17A

Threshold Level 1 = -36dBFS
Compression Ratio 1 = 2:1
Threshold Level 2 = -24dBFS
Compression Ratio 2 = 1.5:1
Reference Gain = 20dBFS

| dBFS of DI | DG | dBFS of DO | AG | dBV of AO2 |
|---|---|---|---|---|
| 0 | 0 | 0 | 0 | 0 |
| -3 | 0 | -3 | 0 | 0 |
| -6 | +2 | -4 | -2 | -6 |
| -15 | +8 | -7 | -8 | -15 |
| -24 | +14 | -10 | -14 | -24 |
| -30 | +17 | -13 | -17 | -30 |
| -36 | +20 | -16 | -20 | -36 |
| -40 | +20 | -20 | -20 | -40 |
| -50 | +20 | -30 | -20 | -50 |
| -60 | +20 | -40 | -20 | -60 |

ELECTRONIC CIRCUIT PERFORMING GAIN CONTROL AND GAIN COMPRESSION TO IMPROVE CHARACTERISTIC OF ANALOG OUTPUT AND ELECTRONIC DEVICE INCLUDING THE SAME

CROSS-REFERENCE TO RELATED APPLICATIONS

The present application claims priority under 35 U.S.C. § 119 to Korean Patent Application No. 10-2017-0077429 filed on Jun. 19, 2017, in Korean Intellectual Property Office, the entire contents of which are incorporated herein by reference.

BACKGROUND

Example embodiments relate to an electronic circuit and/or an electronic device. For example, at least some example embodiments relate to configurations and operations for signal processing in the electronic circuit and/or the electronic device.

In recent years, various kinds of electronic devices are being used. An electronic device performs its own functions according to operations of electronic circuits included therein. For example, various electronic devices, such as a desktop computer, a smart phone, a tablet computer, and/or the like, are widely being used by users, and each electronic device provides a service to a user.

Some electronic devices are implemented to play audio. A user may play multimedia content including sound information, such as music, a voice message, a video, and/or the like, by means of the electronic devices. Meanwhile, most of recently used electronic devices may play the audio based on data of digital sound source.

However, information may be expressed based on a discrete quantity in a digital domain, and thus the information may be lost with regard to e audio playing. In addition, various noises may occur in an analog domain, and thus the noises may be included in the audio being played. Accordingly, audio quality of the final output may be degraded relative to the original digital sound source, due to the noises from a circuit such as a driver of the analog domain.

In addition to the audio playing, electronic devices may provide a variety of analog information to a user based on data of a digital format. Accordingly, unintended effects such as information loss and noises with regard to services of electronic devices may be difficult to avoid.

SUMMARY

Example embodiments may provide configurations and operations for performing gain control and gain compression in an electronic circuit and/or an electronic device, to improve a characteristic of an analog output.

In some example embodiments, an electronic circuit includes a peak detector configured to detect a peak level of a digital input, the digital input being in a digital domain; a gain controller configured to, set a digital gain based on a compressed gain such that the digital gain increases the peak level to a target level, the target level being greater than the peak level and less than or equal to a maximum level allowable in the digital domain, and increase, in a compression interval where the peak level is greater than a threshold level, the digital gain as the peak level decreases the digital gain as the peak level decreases; and a compressor configured to set the compressed gain based on the peak level such that, in the compression interval, a ratio of an increment of the digital gain to a decrement of the peak level is less than a reference ratio.

In some example embodiments, an electronic circuit includes a peak detector configured to detect a peak level of a digital input, the digital input being in a digital domain; a gain controller configured to, set a digital gain based on a compressed gain such that the digital gain increases the peak level to a target level, the target level being greater than the peak level and less than or equal to a maximum level allowable in the digital domain, and increase the digital gain as the peak level decreases; and a compressor configured to set the compressed gain based on the peak level such that a first ratio in a first interval is less than a second ratio in a second interval, wherein the first interval is an interval where the peak level is greater than a threshold level, and the second interval being an interval where the peak level is less than the threshold level, and the first ratio is a ratio of an increment of the digital gain to a decrement of the peak level in the first interval, and the second ratio is a ratio of an increment of the digital gain to a decrement of the peak level in the second interval.

In some example embodiments, an electronic device includes a memory configured to store data associated with a digital input, the digital input being in a digital domain; and an output gain controller circuit configured to set a digital gain such that the electronic device increases a peak level of the digital input to a target level based on the digital gain, the target level being greater than the peak level and less than or equal to a maximum level which is allowable in the digital domain, wherein in a compression interval where the peak level is greater than a threshold level, the output gain controller circuit is configured to increase the digital gain as the peak level decreases such that a ratio of an increment of the digital gain to a decrement of the peak level in the compression interval is less than a reference ratio In some example embodiments, an electronic circuit includes a peak detector configured to detect a peak level from a digital input; and a gain controller configured to set a digital gain such that the digital gain increases the peak level to a target level, the target level being greater than the peak level, the gain controller configured to set the digital gain by, in a first interval where the peak level is greater than a threshold level, increasing the digital gain as the peak level decreases such that a ratio of an increment of the digital gain to a decrement of the peak level in the first interval is less than a reference ratio, and in a second interval where the peak level is less than the threshold level, maintaining the digital gain at a reference gain.

In some example embodiments, an electronic circuit includes a gain controller configured to set a digital gain based on a compressed gain to increase a peak level of a digital input to a target level such that in both a first interval and a second interval the digital gain increases as the peak level decreases, the digital input being in a digital domain, the target level being greater than the peak level and less than or equal to a maximum level allowable in the digital domain, the first interval being an interval of the digital input where the peak level is greater than a first threshold level, and the second interval being an interval of the digital input where the peak level is less than the first threshold level and greater than a second threshold level; and a compressor configured to set the compressed gain such that (i) a first ratio of an increment of the digital gain to a decrement of the peak level in the first interval is less than a reference ratio and (ii) a second ratio of an increment of the digital gain to a decrement of the peak level in the second interval is less than the reference ratio, the first ratio being different from the second ratio.

According to some example embodiments, a noise may be attenuated, and thus a signal-to-noise ratio (SNR) characteristic may be improved with regard to an analog output. In addition, power consumption of an electronic circuit and an electronic device may be reduced. In some example embodiments, a dynamic range characteristic may be improved with regard to audio being played based on data of digital sound source, and quality of the audio may be improved. Accordingly, the user satisfaction may increase,

BRIEF DESCRIPTION OF THE DRAWINGS

The above and other objects and features will become apparent from the following description with reference to the following figures, wherein like reference numerals refer to like parts throughout the various figures unless otherwise specified, and wherein:

FIG. 5 is a conceptual diagram for describing example gain control which is performed by an output gain controller circuit of FIG. 3;

FIGS. 15A to 15C are a table and graphs for describing example gain control and gain compression which is performed by an output gain controller circuit of FIG. 14;

FIGS. 17A to 17C are a table and graphs for describing example gain control and gain compression which is performed by an output gain controller circuit of FIG. 16.

DETAILED DESCRIPTION

Below, some example embodiments will be described in detail and clearly with reference to accompanied drawings such that those skilled in the art can easily implement example embodiments.

I. Overall System Configuration

Figure 1:
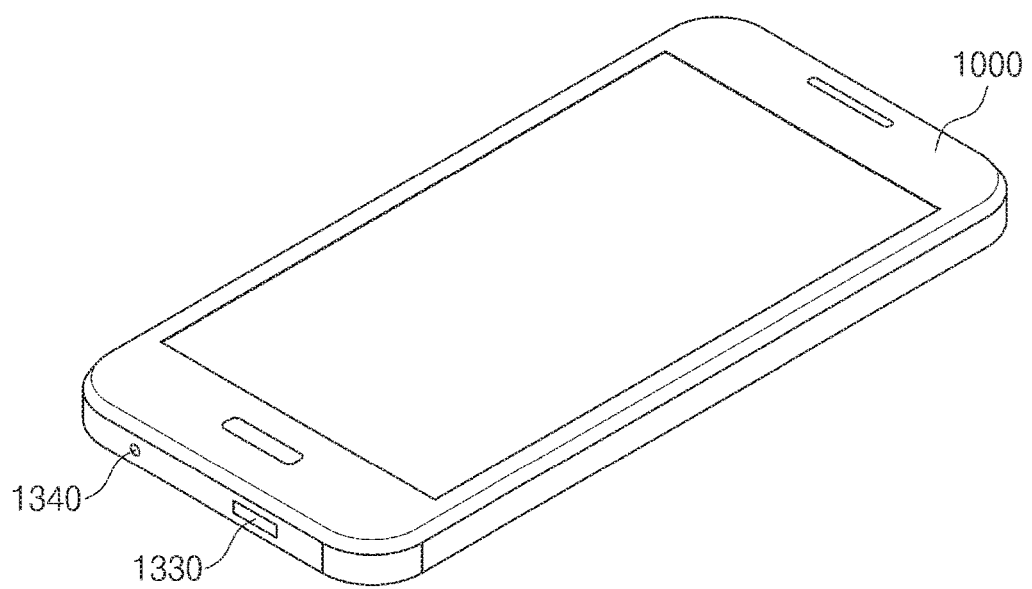
FIG. 1 is a conceptual diagram illustrating an example implementation of an electronic device which may be configured and may operate according to example embodiments.

FIG. 1 is a conceptual diagram illustrating an example implementation of an electronic device 1000 which may be configured and may operate according to example embodiments.

Referring to FIG. 1, the electronic device 1000 may be implemented with an electronic device such as a smart phone, a tablet computer, a laptop computer, and/or the like. However, example embodiments are not limited thereto. Unlike that illustrated in FIG. 1, the electronic device 1000 may be implemented with one of other types of electronic devices such as a wearable device, a desktop computer, a video game console, a workstation, a server, an electric vehicle, and/or the like.

The electronic device 1000 may provide various services to a user according to operations of electronic circuits included in the electronic device 1000. For example, the electronic device 1000 may play audio for a user. The user may play multimedia content including sound information, such as music, a voice message, a video, and/or the like, by means of the electronic device 1000, For example, the electronic device 1000 may include a speaker 1330 for outputting the audio being played to the user. For example, the electronic device 1000 may include an audio terminal 1340, which may be connected with a headphone or an in-ear headphone for outputting the audio being played to the user. For example, the electronic device 1000 may include a communication circuit for wirelessly outputting the audio being played to a speaker and/or a headphone. Accordingly, the user may listen to the audio being played by the electronic device 1000.

However, the audio playing is an example provided to facilitate better understanding, and is not intended to limit example embodiments. The electronic device 1000 may further provide various other functions in addition to the audio playing.

Figure 2:
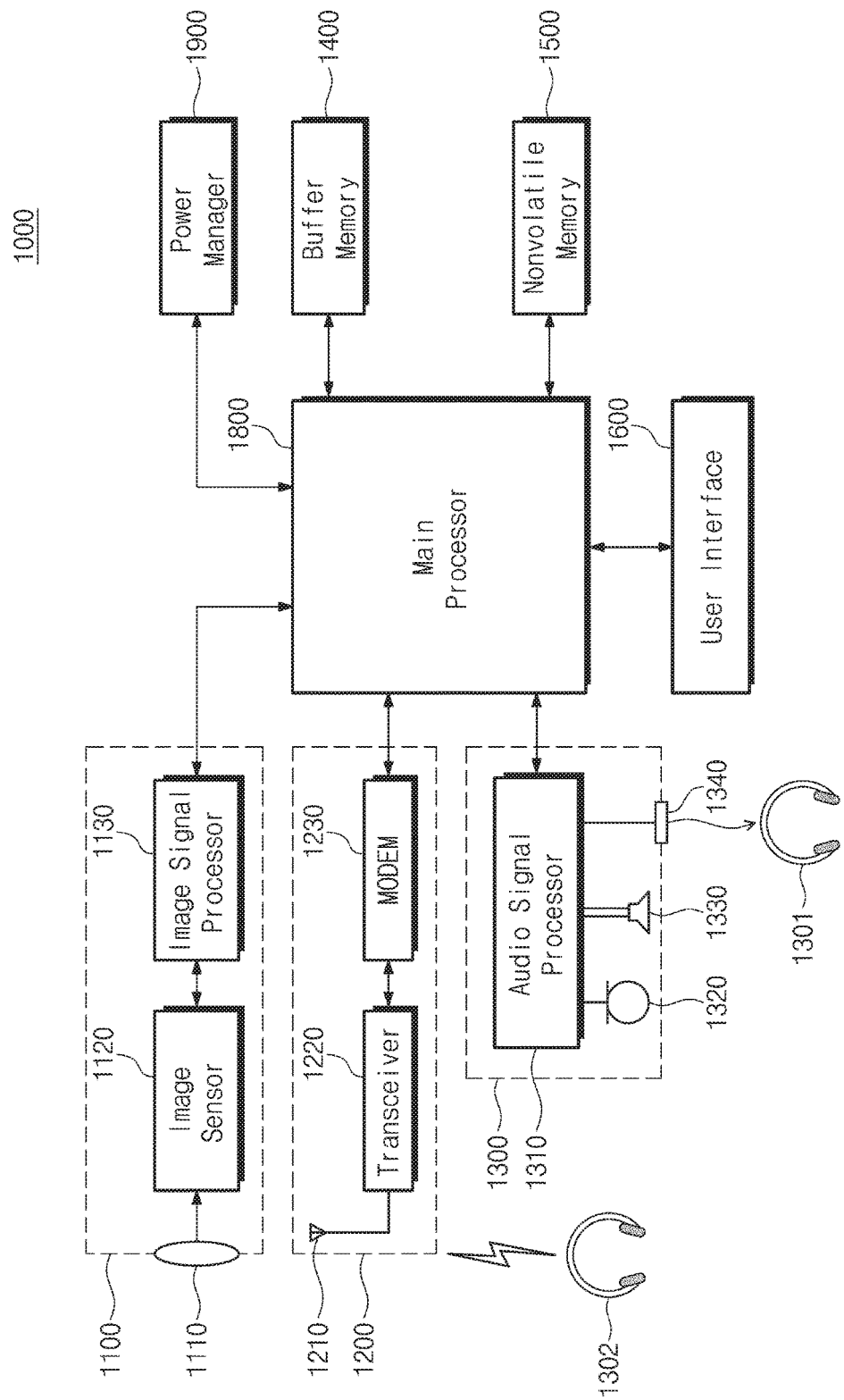
FIG. 2 is a block diagram illustrating an example configuration of an electronic device of FIG. 1 including an electronic circuit which may be configured and may operate according to example embodiments.

FIG. 2 is a block diagram illustrating an example configuration of the electronic device 1000 of FIG. 1 including an electronic circuit which may be configured and may operate according to example embodiments.

Referring to FIG. 2, the electronic device 1000 may include various electronic circuits. For example, the electronic circuits of the electronic device 1000 may include an image processing block 1100, a communication block 1200, an audio processing block 1300, a buffer memory 1400, a nonvolatile memory 1500, a user interface 1600, a main processor 1800, and a power manager 1900.

The image processing block 1100 may receive light through a lens 1110. An image sensor 1120 and an image signal processor 1130 included in the image processing block 1100 may generate image information associated with an external object, based on the received light.

The communication block 1200 may exchange signals with an external device/system through an antenna 1210. A transceiver 1220 and a modulator/demodulator (MODEM) 1230 of the communication block 1200 may process signals exchanged with the external device/system, in compliance with a wireless communication protocol such as long term evolution (LTE), worldwide interoperability for microwave access (WIMAX), global system for mobile communication (GSM), code division multiple access (CDMA), Bluetooth, near field communication (NFC), wireless fidelity (Wi-Fi), radio frequency identification (MD), and/or the like.

The audio processing block 1300 may process sound information by using an audio signal processor 1310, and thus may play and output audio. The audio processing block 1300 may receive an audio input through a microphone 1320. The audio processing block 1300 may output the audio being played through the speaker 1330. A headphone 1301 may be connected with the audio terminal 1340 of the audio processing block 1300, and the audio processing block 1300 may output the audio being played through the headphone 1301.

In some cases, a headphone 1302 may be wirelessly connected with the communication block 1200 (e.g., in compliance with a wireless communication protocol such as Bluetooth or NFC). A signal of the audio being played by the audio processing block 1300 may be output to the headphone 1302 wirelessly through the communication block 1200. To this end, the audio processing block 1300 may communicate with the communication block 1200 directly or through the main processor 1800, The buffer memory 1400 may store data to be used for an operation of the electronic device 1000. For example, the buffer memory 1400 may temporarily store data processed or to be processed by the main processor 1800. For example, the butter memory 1400 may include a volatile memory, such as a static random access memory (SRAM), a dynamic RAM (DRAM), a synchronous DRAM (SDRAM), and/or the like, and/or a nonvolatile memory, such as a flash memory, a phase-change RAM (PRAM), a magneto-resistive RAM (MRAM), a resistive RAM (ReRAM), a ferroelectric RAM (FRAM), and/or the like.

The nonvolatile memory 1500 may store data regardless of power being supplied. For example, the nonvolatile memory 1500 may include at least one of various nonvolatile memories such as a flash memory, a PRAM, a MRAM, a ReRAM, a FRAM, and/or the like. For example, the nonvolatile memory 1500 may include a removable memory device such as a hard disk drive (HDD), a solid state drive (SSD), a secure digital (SD) card, and/or the like, and/or an embedded memory such as an embedded multimedia card (eMMC) and/or the like.

The user interface 1600 may arbitrate communication between a user and the electronic device 1000. For example, the user interface 1600 may include input interfaces such as a keyboard, a mouse, a keypad, a button, a touch panel, a touch screen, a touch pad, a touch ball, a gyroscope sensor, a vibration sensor, an acceleration sensor, and/or the like. For example, the user interface 1600 may include output interfaces such as a liquid crystal display (LCD) device, a light emitting diode (LED) display device, an organic LED (OLED) display device, an active matrix OLED (AMO-LED) display device, a motor, and/or the like.

The main processor 1800 may control overall operations of the electronic device 1000. The main processor 1800 may control/manage operations of components of the electronic device 1000. The main processor 1800 may process various operations to operate the electronic device 1000. For example, the main processor 1800 may be implemented with a general-purpose processor, a special-purpose processor, or an application processor.

The power manager 1900 may power components of the electronic device 1000. For example, the power manager 1900 may suitably convert power received from a battery and/or an external power source, and may transfer the converted power to the components of the electronic device 1000.

However, the example components illustrated in FIG. 2 are provided to facilitate better understanding, and are not intended to limit example embodiments. The electronic device 1000 may not include one or more of the components illustrated in FIG. 2, or may further include at least one component which is not illustrated in FIG. 2.

Meanwhile, the buffer memory 1400 and/or the nonvolatile memory 1500 may store data of a digital format. The electronic device 1000 may provide a service based on digital data stored in the buffer memory 1400 and/or the nonvolatile memory 1500. For example, the nonvolatile memory 1500 may store data of digital sound source provided from a user. For example, the buffer memory 1400 may store data of digital sound source streaming through the communication block 1200. The electronic device 1000 may play the audio by the audio processing block 1300 based on data of digital sound source.

However, due to a characteristic of a digital domain in which information is expressed based on a discrete quantity, information loss may occur with regard to the audio being played based on data of digital sound source. In addition, due to a characteristic of an analog domain which provides a path for outputting the audio being played to a user, various noises (e.g., a white noise due to supplied power, a thermal noise due to a process or element characteristic, and/or the like) may be included in the audio.

In addition to the audio playing, the electronic device 1000 may provide a variety of analog information to a user based on digital data. Accordingly, unintended results such as an information loss and noises may be caused with regard to operations of the electronic device 1000. For example, the audio quality of the final analog output may be degraded relative to the original digital sound source, due to a noise from a circuit such as a driver of an analog domain. Example embodiments may provide configurations and operations of an electronic circuit for reducing or resolving the unintended results.

In the following description, examples associated with the audio signal processor 1310 which is able to be configured and to operate according to some of the example embodiments will be provided. However, the following examples are provided to facilitate better understanding, and are not intended to limit the example embodiments. It may be readily understood that the example embodiments are applied to any electronic circuit and any electronic device other than the audio signal processor 1310.

II. Overview of Gain Control

Figure 3:
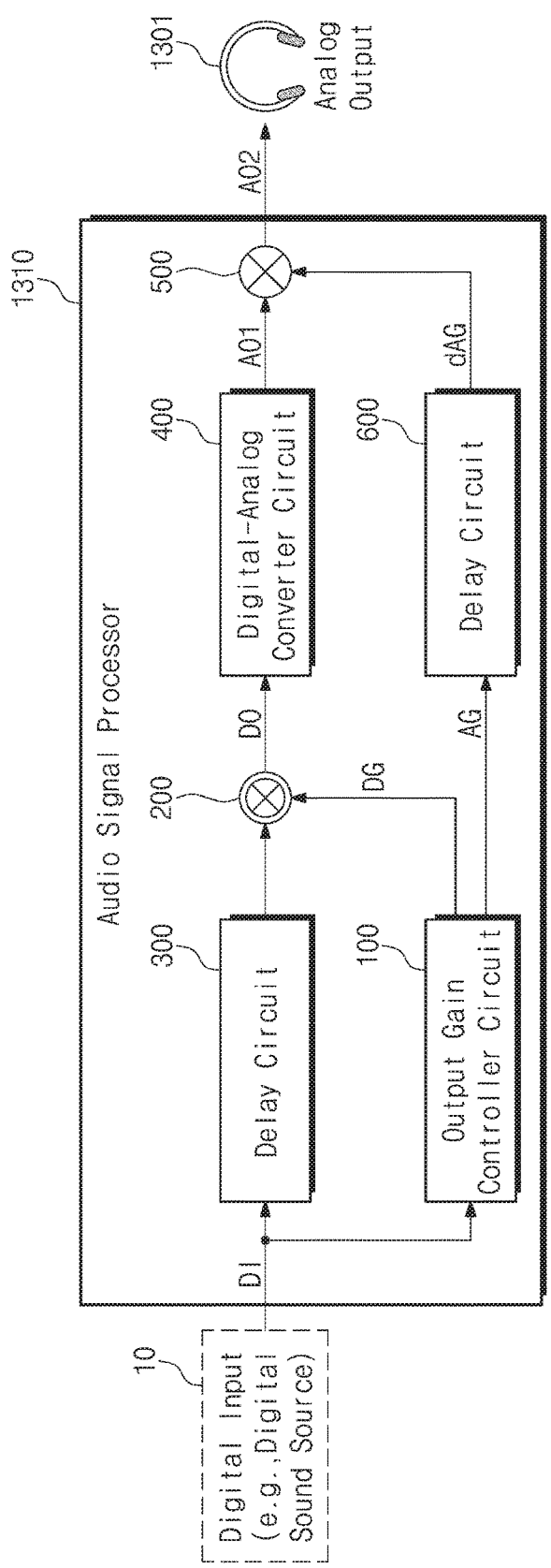
FIG. 3 is a block diagram illustrating an example configuration of an audio signal processor of FIG. 2.

FIG. 3 is a block diagram illustrating an example configuration of the audio signal processor 1310 of FIG.

Referring to FIG. 3, in some example embodiments, the audio signal processor 1310 may include an output gain controller circuit 100, a digital mixer circuit 200, a digital-analog converter circuit 400, an analog mixer circuit 500, and a delay circuit 600. However, example embodiments are not limited to that illustrated in FIG. 3. The audio signal processor 1310 may not include one or more of the components illustrated in FIG. 3, or may further include at least one component which is not illustrated in FIG. 3.

In some example embodiments, the audio signal processor 1310 may include discrete processing circuitry, in other example embodiments the audio signal processing 1310 may he embodied in the main processor 1800.

The audio signal processor 1310 (or alternatively, the main processor 1800 embodied as the audio signal processor 1310) may be an arithmetic logic unit, a digital signal processor, a microcomputer, a field programmable array, a programmable logic unit, a microprocessor or any other device capable of responding to and executing instructions in a defined manner.

The audio signal processor 1310 (or alternatively, the main processor 1800 embodied as the audio signal processor 1310) may read computer readable code from a memory (e.g., the buffer memory 1400 and/or the non-volatile memory 1500). The computer readable code, when executed by the audio signal processor 1310 (or alternatively, the main processor 1800 embodied as the audio signal processor 1310), may configure the audio signal processor 1310 (or alternatively, the main processor 1800 embodied as the audio signal processor 1310) as a special purpose corrupter to perform the operations of the output gain controller circuit 100, the digital mixing circuit 200, the digital-analog converter circuit 400, the analog mixer circuit 500, and the delay circuit 600.

For example, the computer readable code, when executed by the audio signal processor 1310 (or alternatively, the main processor 1800 embodied as the audio signal processor 1310), may configure the audio signal processor 1310 (or alternatively, the main processor 1800 embodied as the audio signal processor 1310) to set a compressed gain based on a peak level of a digital signal such that, in a compression interval where the peak level is greater than a threshold level, a ratio of an increment of the digital gain to a decrement of the peak level in is less than a reference ratio, set a digital gain based on the compressed gain such that the digital gain increases as the peak level decreases, and increase a peak level of a digital signal to a target level based on the digital gain, the target level being greater than the peak level and less than or equal to a maximum level allowable in the digital domain.

A digital input 10 may be provided to the audio signal processor 1310. For example, the digital input 10 may include data of digital sound source. For example, the buffer memory 1400 and/or the nonvolatile memory 1500 may store data associated with the digital input 10.

The audio signal processor 1310 may receive a digital input DI included in the digital input 10. The digital input DI may include some or all portions of the data associated with the digital input 10. For example, the digital input DI may include data associated with a waveform of audio, signal characteristics (e.g., a signal level, a sampling frequency, and a bitrate) of the audio, and/or the like.

The output gain controller circuit 100 may receive the digital input DI. The output gain controller circuit 100 may detect a signal level from the digital input DI. For example, the signal level may be detected in each and every sampling period. For example, the output gain controller circuit 100 may detect a peak level from the digital input DI. The peak level may correspond to a detected signal level of a time point where a change in the detected signal level switches from increase to decrease.

The output gain controller circuit 100 may output a digital gain DG based on the peak level. The digital gain DG may be associated with increasing the peak level to a target level. The target level may be greater than the peak level, but may be equal to or less than a maximum level which is allowable in a digital domain. Accordingly, under control of the output gain controller circuit 100, the peak level may not exceed the allowable maximum level even though the peak level increases to the target level.

The digital gain DG may correspond to a value which is referenced to increase the peak level to the target level. The digital gain DG may correspond to a level difference between the peak level and the target level. The digital gain DG may be provided to the digital mixer circuit 200.

A delay circuit 300 may receive the digital input DI. The delay circuit 300 may delay transfer of the digital input DI by a transmission delay of the output gain controller circuit 100. The delay circuit 300 may provide the delayed digital input DI to the digital mixer circuit 200.

Accordingly, the digital mixer circuit 200 may receive the delayed digital input DI in synchronization with the digital gain DG. However, when the digital mixer circuit 200 itself has capability to buffer, the audio signal processor 1310 may not include the delay circuit 300. The digital mixer circuit 200 may increase the peak level detected from the (delayed) digital input DI by the digital gain DG. Accordingly, the peak level may increase to the target level.

The digital mixer circuit 200 may generate a digital output DO. The digital output DO may be generated to have the target level based on the digital gain DG. The digital output DO may be provided to the digital-analog converter circuit 400. The digital-analog converter circuit 400 may convert the digital output DO to an analog output AO1. For example, the digital-analog converter circuit 400 may include a digital filter. The analog output AO1 may be provided to the analog mixer circuit 500.

Meanwhile, the output gain controller circuit 100 may further output an analog gain AG. The analog gain AG may be associated with decreasing a signal level of the analog output AO1.

The delay circuit 600 may receive the analog gain AG. The delay circuit 600 may delay transfer of the analog gain AG by a transmission delay of the digital-analog converter circuit 400. The delay circuit 600 may provide the delayed analog gain dAG to the analog mixer circuit 500.

Accordingly, the analog mixer circuit 500 may receive the analog output AO1 in synchronization with the delayed analog gain dAG. The analog mixer circuit 500 may decrease a signal level of the analog output AO1 by the delayed analog gain dAG. Accordingly, the analog mixer circuit 500 may generate a final analog output AO2. For example, the final analog output AO2 may be transferred to the headphone 1301 (in some cases, to the speaker 1330 and/or the headphone 1302), and thus, a user may listen to the audio being played based on the final analog output AO2.

For example, a magnitude of the analog gain AG may be similar (or, alternatively, identical) to a magnitude of the digital gain DG, and a sign of the analog gain AG may be opposite to a sign of the digital gain DG. In this example, a signal level of the analog output AO1 may decrease to a signal level of the analog output AO2 based on the analog gain AG by a quantity by which the peak level of the digital input DI increases to the target level of the digital output DO based on the digital gain DG.

That is, the analog gain AG may compensate for a level boost which is performed based on the digital gain DG. Accordingly, under control of the output gain controller circuit 100, a net gain may be maintained at zero (0) on a full path of the audio signal processor 1310.

As a result, even though the peak level of the digital input DI increases based on the digital gain DG, a user may listen to the audio based on the final analog output AO2 having a signal level which is originally intended in the digital input 10. Such gain control will be further described with reference to FIGS. 5 to 6C.

Figure 4:
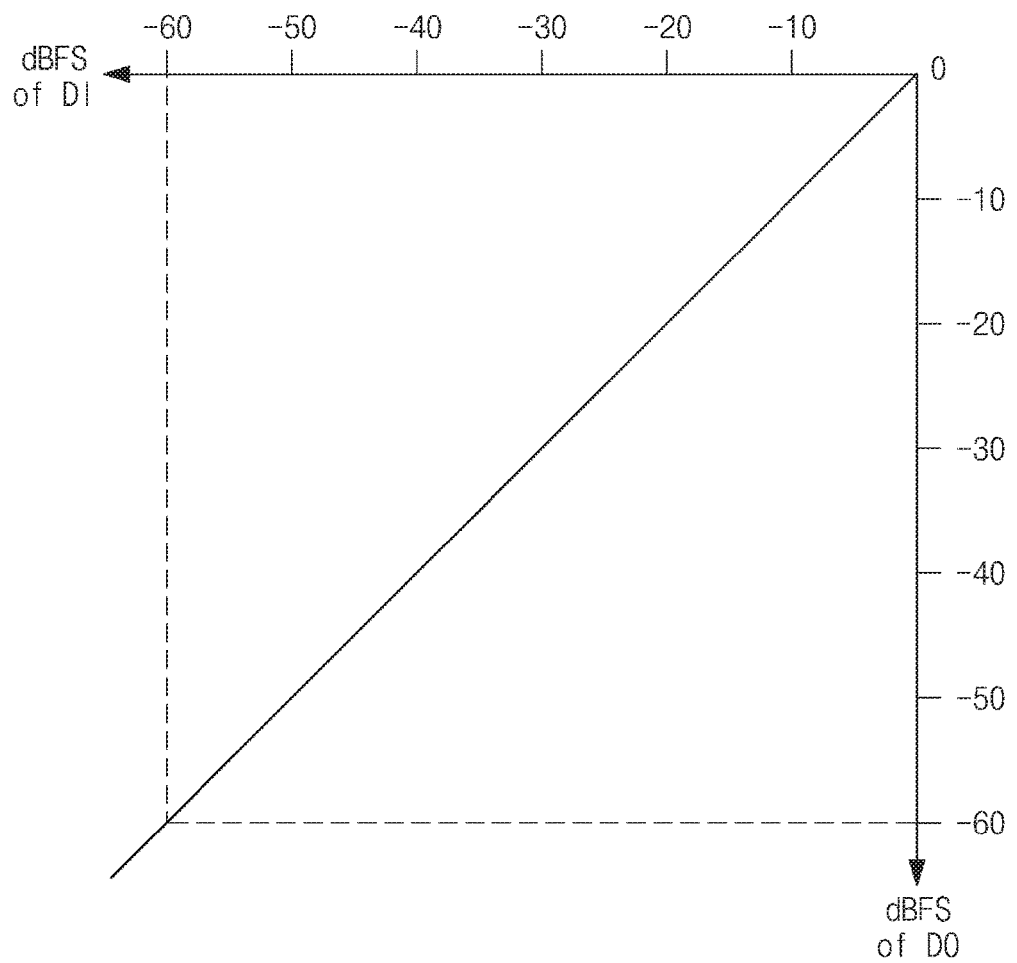
FIG. 4 is a graph illustrating an example relationship between a peak level of a digital input and a target level of a digital output with regard to an audio signal processor of FIG. 3.

FIG. 4 is a graph illustrating an example relationship between a peak level of the digital input DI and a target level of the digital output DO with regard to the audio signal processor 1310 of FIG. 3.

Referring to FIG. 4, below, to facilitate better understanding, a unit of "dBFS (Decibel per Full Scale)" will be used with regard to a signal level of the digital input DI or the digital output DO. For example, with regard to the dBFS unit, 0 dBFS may be selected as the maximum level which is allowable in a digital domain, and a minimum level may be determined depending on resolution of the digital domain. Below, it will be assumed that the minimum level is −100 dBFS.

Meanwhile, to facilitate better understanding, a unit of "dBV (Decibel per Volt)" will be used with regard to a signal level of the analog output AO1 or AO2. For example, with regard to the dBV unit, 0 dBV may be selected as a signal level corresponding to 1V. A unit magnitude of the dBV unit may be the same as a unit magnitude of the dBFS unit.

However, the dBFS unit, the dBV unit, the above examples, and the above assumption are provided to facilitate better understanding, and are not intended to limit example embodiments. Units of signal levels processed in the audio signal processor 1310 may be variously changed, and a unit magnitude, a reference level, a maximum level, and a minimum level may be variously modified or changed depending on a circuit design.

Unlike that illustrated in FIG. 3, when the audio signal processor 1310 does not include the output gain controller circuit 100 and the digital gain DG and the analog gain AG are not generated, a peak level of the digital input DI may be identical to a target level of the digital output DO as illustrated in FIG. 4 (i.e., it may be understood as the digital gain DG being 0). For example, when a peak level of the digital input DI is −60 dBFS, a target level of the digital output DO may also be −60 dBFS. On the other hand, when the audio signal processor 1310 includes the output gain controller circuit 100 as illustrated in FIG. 3, example gain control which will be described with reference to FIGS. 5 to 6C may be performed.

FIG. 5 is a conceptual diagram for describing example gain control which is performed by the output gain controller circuit 100 of FIG. 3.

Referring to a left graph of NG. 5, the digital input DI may have signal levels between a maximum level and a minimum level which are allowable in a digital domain. As assumed above, the maximum level may be 0 dBFS, and the minimum level may be −100 dBFS. A full range between the maximum level and the minimum level may be changed depending on resolution of the digital domain.

For example, the digital input DI may have a peak level P1 at a specific time point. The output gain controller circuit 100 may output the digital gain DG which is referenced to increase the peak level P1 to a target level P1a. Accordingly, referring to a middle graph of FIG. 5, the digital output DO may have the target level P1a at a specific time point. In addition, the analog output AO1 may be converted from the digital output DO, and may have a signal level corresponding to the target level P1a at a specific time point.

The output gain controller circuit 100 may output the analog gain AG referenced to decrease a signal level which has been increased based on the digital gain DG. The analog gain AG may be associated with decreasing the signal level P1a to a signal level P1b. The signal level P1b may correspond to the signal level P1.

Accordingly, referring to a right graph of FIG. 5, the final analog output AO2 may have the signal level P1b at a specific time point. As a result, the signal level P1a may decrease to the signal level P1b by a quantity by which the peak level P1 increases the target level P1a, and a net gain may be maintained at zero on a full path of the audio signal processor 1310.

The digital input DI and the digital output DO may be expressed based on discrete quantized data. The discrete quantized data may not include a noise.

On the other hand, each of the analog output AO1 and the final analog output AO2 may include a noise. For example, the noise may include a white noise due to power supplied from the power manager 1900, a thermal noise due to characteristics of components included in the audio signal processor 1310 and a characteristic of a process of manufacturing the components, and/or the like. When the final analog output AO2 includes a noise, quality of a service provided to a user may be degraded.

However, boosting a signal level based on the digital gain DG in the digital domain may not increase a noise, and restoring the signal level based on the analog gain AG in the analog domain may attenuate a noise. Thus, according to example embodiments, the gain control may reduce an amount or intensity of a noise included in the final analog output AO2 on a full path of the audio signal processor 1310.

As a result, a signal-to-noise ratio (SNR) characteristic may be improved with regard to the final analog output AO2, and power consumption due to a noise may decrease. In addition, a set of operations to be described below, including boosting a signal level based on the digital gain DG, may improve a dynamic range characteristic and may improve quality of audio being played.

For example, the target level P1a may be selected to have the maximum level (e.g., 0 dBFS) which is allowable in the digital domain. However, the target level P1a may not exceed the maximum level. Increasing the peak level P1 to the maximum level may expand the dynamic range maximally, and thus improvement on a characteristic and quality may be maximized.

The one peak level P1 is described with reference to FIG. 5, but the output gain controller circuit 100 may detect a signal level of the digital input DI in each and every sampling period. Accordingly, the output gain controller circuit 100 may detect several peak levels over time, and may provide dynamic gain control in real time based on the digital gain DG and the analog gain AG with regard to each of the peak levels. The digital gain DG and the analog gain AG may vary based on a detected peak level.

The sampling period may be the same as or different from a period of the digital input DI. The sampling period may be associated with performance and efficiency of the gain control, and may be variously implemented depending on intention of a designer. The sampling period may be fixed or may be dynamically variable.

To facilitate better understanding, FIG. 5 illustrates that each of the digital input DI and the digital output DO has a waveform of a continuous wave. However, in some cases, the digital input DI and the digital output DO may have a discontinuous waveform based on quantized data. Example embodiments are not limited to the illustration in FIG. 5.

Figures 6A, 6B:
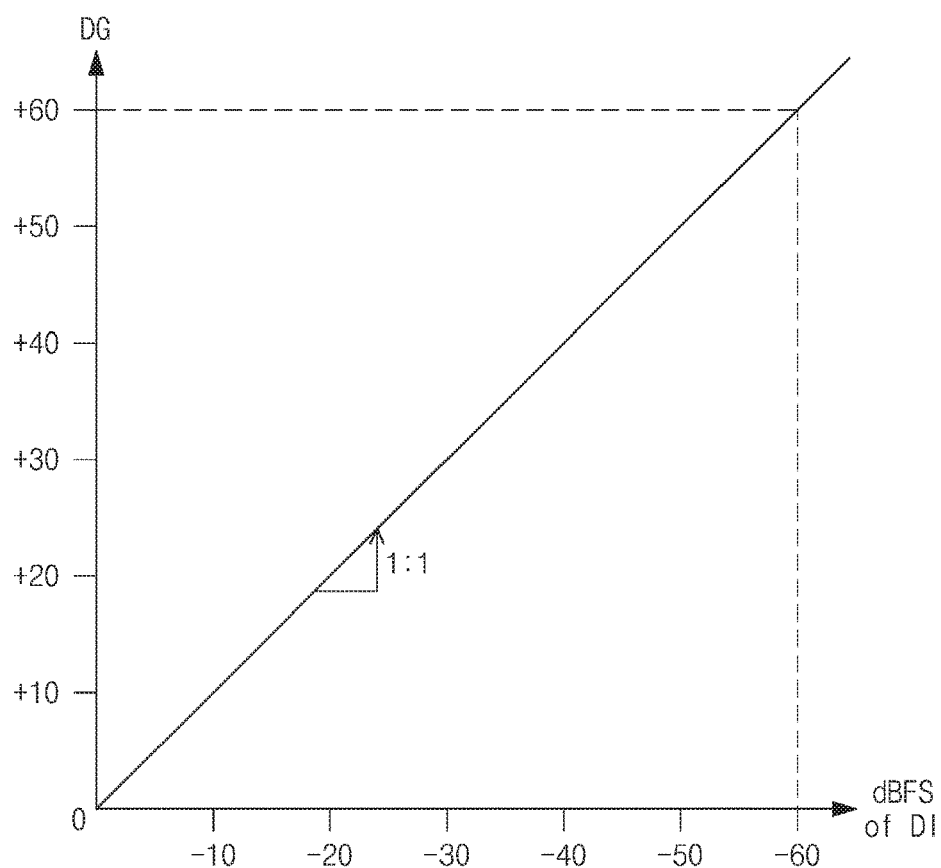
FIGS. 6A to 6C are a table and graphs for more fully describing example gain control of FIG. 5.
Figure 6C:
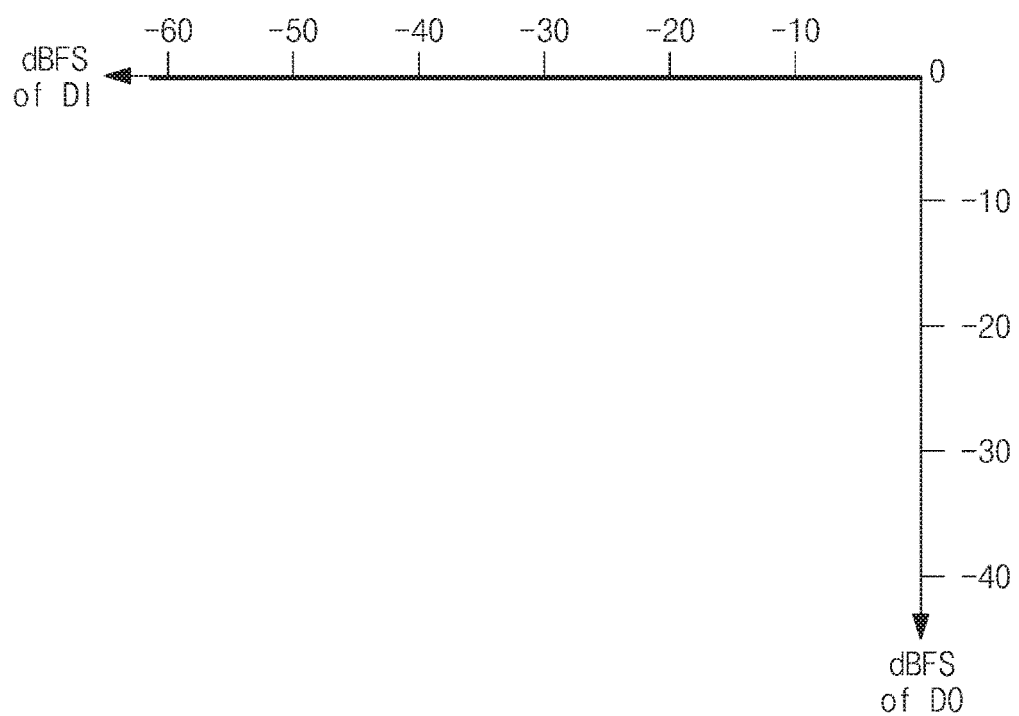

FIGS. 6A to 6C are a table and graphs for more fully describing the example gain control of FIG. 5.

Referring to FIG. 6A, the table of FIG. 6A illustrates an example relationship between a peak level of the digital input DI, the digital gain DG, and a target level of the digital output DO. Further, the table of FIG. 6A additionally illustrates an example relationship associated with the analog gain AG and a signal level of the final analog output AO2.

As described with reference to FIG. 5, example gain control may be performed to increase a peak level of the digital input DI to the maximum level which is allowable in the digital domain. For example, referring to FIG. 6A, for example, when a peak level of the digital input DI is −30 dBFS, the digital gain DG may be +30 dBFS. Accordingly, a target level of the digital output DO may become the maximum level (e.g., 0 dBFS).

In this example, the analog gain AG may be −30 dBV to compensate for a level boost which is provided based on the digital gain DG. Accordingly, a signal level of the final analog output AO2 may be −30 dBV. As can be understood, the final analog output AO2 may have a signal level which is originally intended in the digital input DI.

The graph of FIG. 6B illustrates a relationship between a peak level of the digital input DI and the digital gain DG in the table of FIG. 6A. When it is intended to increase a peak level of the digital input DI to the maximum level, the digital gain DG may increase as a peak level of the digital input DI decreases. For example, the digital gain DG may increase by a quantity by which a peak level of the digital input DI decreases.

In the example of FIG. 6B, when a unit magnitude of a peak level of the digital input DI is the same as a unit magnitude of the digital gain DG, a ratio of an increment of the digital gain DG to a decrement of a peak level of the digital input DI may be 1:1. However, when the unit magnitude of a peak level of the digital input DI is different from the unit magnitude of the digital gain DG, the ratio may have a value different from 1:1. To facilitate better understanding, a ratio of an increment of the digital gain DG to a decrement of a peak level of the digital input DI in case where the digital gain DG increases by a quantity by which a peak level of the digital input DI decreases may be referred to as a "reference ratio" below.

The graph of FIG. 6C illustrates a relationship between a peak level of the digital input DI and a target level of the digital output DO in the table of FIG. 6A. For example, a target level of the digital output DO may be selected to have the maximum level (e.g., 0 dBFS) which is allowable in the digital domain.

Figure 7:
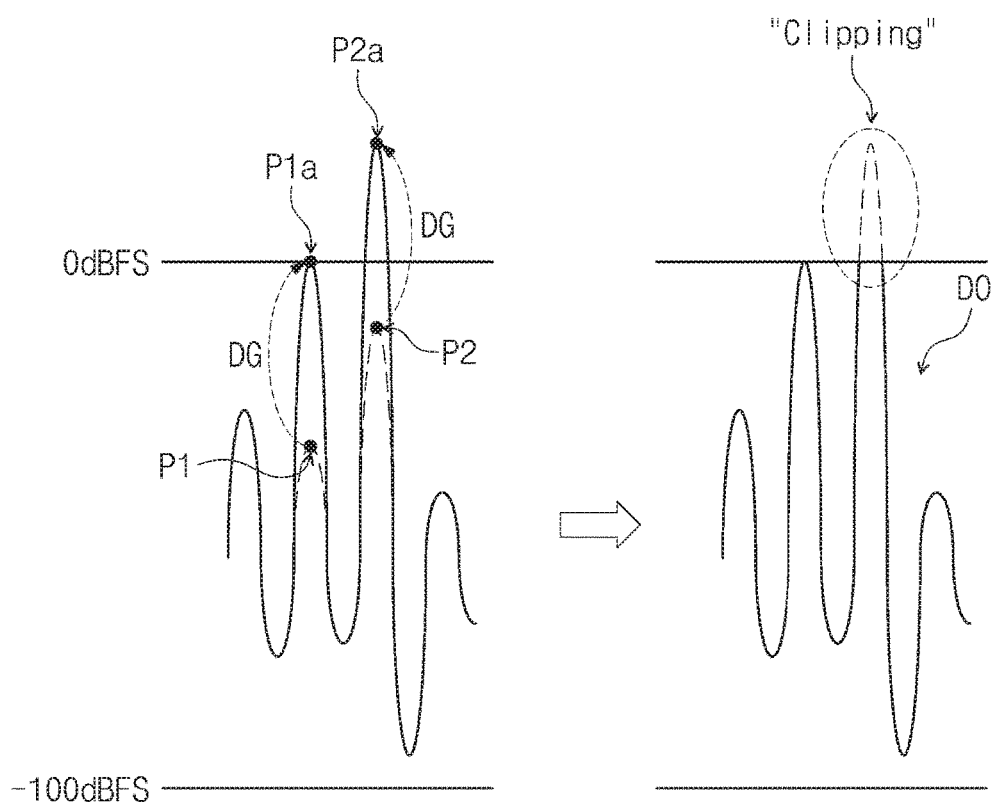
FIG. 7 is a conceptual diagram for describing information loss which may occur in a digital output by example gain control of FIG. 5.

FIG. 7 is a conceptual diagram for describing information loss which may occur in a digital output by the example gain control of FIG. 5.

Referring to FIGS. 5-7, as described with reference to FIGS. 5 to 6C, in some cases, a target level of the digital output DO may be selected to have the maximum level which is allowable in the digital domain. Referring to a left graph of FIG. 7, the output gain controller circuit 100 may output the digital gain DG such that a peak level P1 increases to a target level P1a.

However, in some cases, a sampling period of the output gain controller circuit 100 may be longer than a period of the digital input DI, or a signal level of the digital input Di may vary sharply or quickly. In such cases, the output gain controller circuit 100 may fail to appropriately respond to a change in a peak level of the digital input DI. In some cases, the digital mixer circuit 200 may fail to appropriately process a change in a peak level of the digital input DI.

For example, the digital input DI may have a peak level P2 after a sampling period where the peak level P1 is detected. When the output gain controller circuit 100 fails to appropriately respond to the peak level P2, the digital gain DG may not be changed to correspond to the peak level P2 and may be maintained to correspond to the peak level P1. In this case, the peak level P2 may increase to a signal level P2a based on the digital gain DG. For example, the signal level P2a may exceed the maximum level which is allowable in the digital domain.

Referring to a right graph of FIG. 7, when the signal level P2a exceeds the maximum level which is allowable in the digital domain, information corresponding to the excess between the signal level P2a and the maximum level may be lost. A waveform of the digital output DO may be clipped, and the final analog output AO2 generated based on the clipped digital output DO may cause distorted audio playing.

III. Gain Control Accompanying Gain Compression

Figure 8:
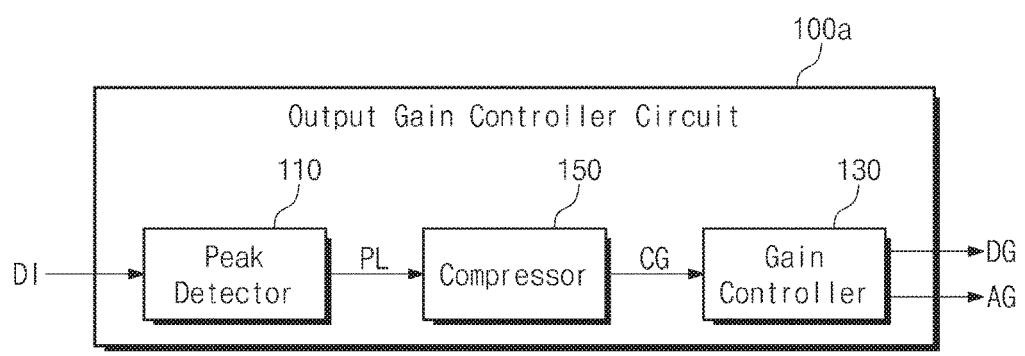
FIG. 8 is a block diagram illustrating an example configuration of an output gain controller circuit of FIG. 3 according to some example embodiments.

FIG. 8 is a block diagram illustrating an example configuration of the output gain controller circuit 100 of FIG. 3 according to some example embodiments.

Referring to FIGS. 3 and 8, in some example embodiments, the output gain controller circuit 100 of FIG. 3 may include an output gain controller circuit 100a of FIG. 8. For example, the output gain controller circuit 100a may include a peak detector 110, a gain controller 130, and a compressor 150.

The peak detector 110 may receive the digital input DI. The peak detector 110 may detect a peak level PL from the digital input DI. For example, the peak detector 110 may detect a signal level from the digital input DI in each and every sampling period. For example, the peak detector 110 may detect, as the peak level PL, the detected signal level of a time point where a change in the detected signal level switches from increase to decrease. For example, the peak detector 110 may track an absolute value of the detected signal level to detect both a positive peak level and a negative peak level.

The gain controller 130 may control generating the digital gain DG and the analog gain AG. The gain controller 130 may output the digital gain DG and the analog gain AG. The digital gain DG and the analog gain AG have been described with reference to FIGS. 3 to 6C.

In some cases, the digital gain DG may be generated based on the peak level PL which is detected by the peak detector 110. For example, the digital gain DG may be generated to increase the peak level PL to the maximum level which is allowable in the digital domain. However, as described with reference to FIG. 7, in some cases, the digital gain DG may cause a target level exceeding the maximum level.

Accordingly, the compressor 150 may generate a compressed gain CG based on the peak level PL. It may be understood as the compressor 150 generating the compressed gain CG by compressing a rate of increase in the digital gain DG. The compressor 150 may provide the compressed gain CG to the gain controller 130. In some cases, the gain controller 130 may output the compressed gain CG as the digital gain DG.

For example, the compressor 150 may operate based on parameters of a threshold level and a compression ratio. For example, the compressor 150 may compress an input level exceeding the threshold level according to the compression ratio, and thus may output a compressed level which increases more slowly than before compression.

Meanwhile, in example embodiments, the compressor 150 may be employed to compress a rate of increase in the digital gain DG, not to compress a rate of increase in a signal level. Example gain compression provided by the compressor 150 will be described with reference to FIGS. 9A to 10C.

FIG. 8 illustrates that the compressor 150 is separate from the gain controller 130. However, in some example embodiments, the gain controller 130 may include the compressor 150, or the gain controller 130 may perform the function of the compressor 150.

Figures 9A, 9B:
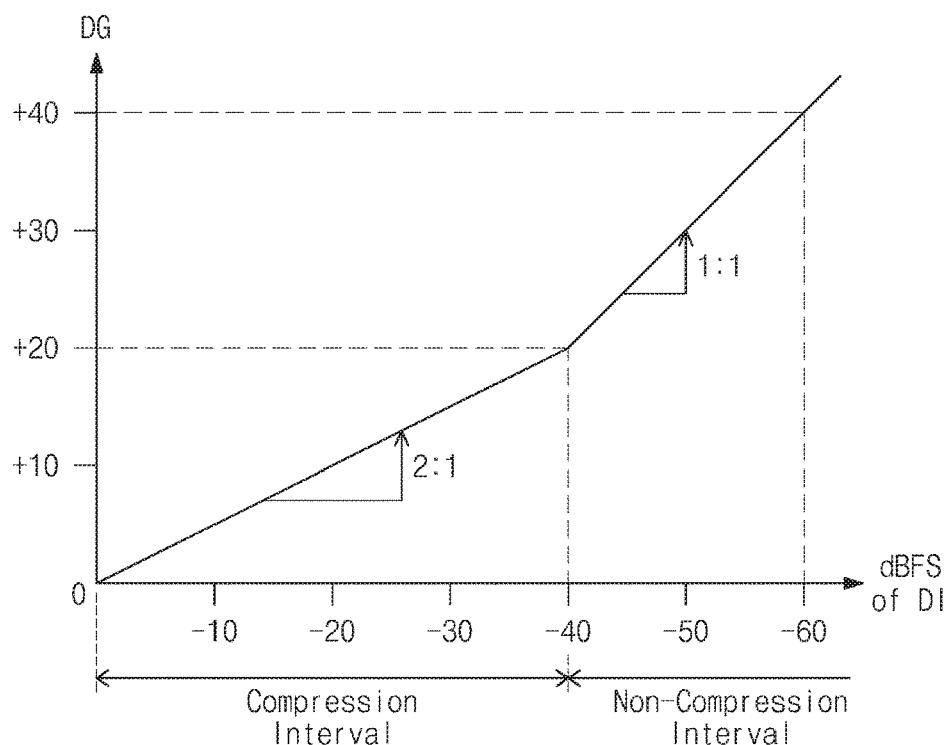
FIGS. 9A to 10C are tables and graphs for describing example gain control and gain compression which is performed by an output gain controller circuit of FIG. 8.
Figure 9C:
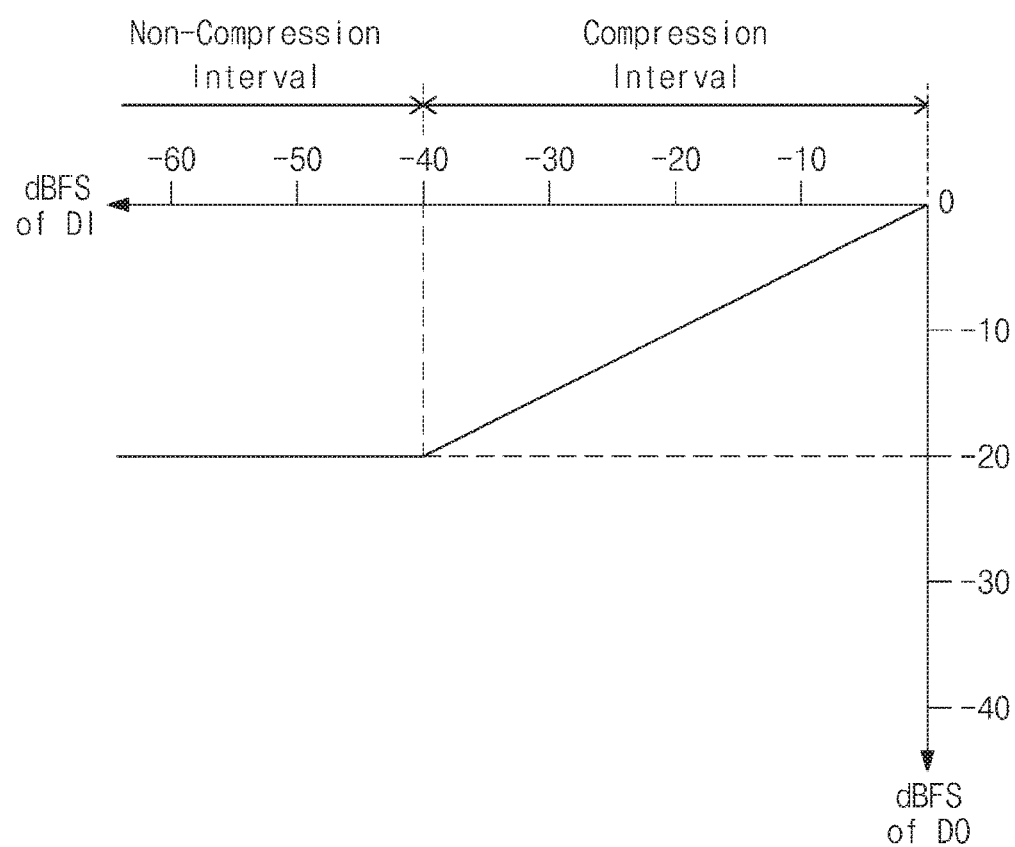

FIGS. 9A to 9C are a table and graphs for describing example gain control and gain compression which is performed by the output gain controller circuit 100a of FIG. 8.

Referring to FIGS. 9A and 9C, FIGS. 9A and 9C illustrate an example where a threshold level of the compressor 150 is −40 dBFS and a compression ratio of the compressor 150 is 2:1. In this example, the compressor 150 may compress an input level exceeding −40 dBFS according to a compression ratio of 2:1. However, this example is provided to facilitate better understanding, and is not intended to limit example embodiments. The threshold level and the compression ratio may be variously changed or modified depending on implementation of the compressor 150 and the output gain controller circuit 100a.

The table of FIG. 9A illustrates an example relationship between a peak level of the digital input DI, the digital gain DG, and a target level of the digital output DO. Further, the table of FIG. 9A additionally illustrates an example relationship associated with the analog gain AG and a signal level of the final analog output AO2. However, the example relationship associated with the analog gain AG and the signal level of the final analog output AO2 may be substantially the same as or similar to that described with reference to FIG. 6A, and thus redundant description will be omitted below.

The graph of FIG. 9B illustrates a relationship between a peak level of the digital input DI, and the digital gain DG in the table of FIG. 9A. The graph of FIG. 9C shows a relationship between a peak level of the digital input DI and a target level of the digital output DO in the table of FIG. 9A.

The compressor 150 may receive a peak level of the digital input DI as an input level. Referring to FIG. 9B, an interval where a peak level of the digital input DI is greater than −40 dBFS may be a compression interval where an input level is compressed by the compressor 150. On the other hand, an interval where a peak level of the digital input DI is less than −40 dBFS may be a non-compression interval where the compressor 150 does not operate.

With regard to the digital input DI which has a peak level exceeding −40 dBFS, the compressor 150 may output the digital gain DG which is compressed according to the compression ratio of 2:1, i.e., may output the compressed gain CG. In the compression interval, the compressor 150 may generate the compressed gain CG such that the digital gain DG increases by a quantity which is less than a quantity by which a peak level of the digital input DI decreases.

For example, referring to FIGS. 9A and 9B, in the compression interval, a ratio of an increment of the digital gain DG to a decrement of a peak level of the digital input DI may be 2:1 (i.e., while a peak level of the digital input DI decreases by two unit magnitudes, the digital gain DG increases by one unit magnitude). For example, this ratio may be selected such that a target level of the digital output DO increases as a peak level of the digital input DI increases in the compression interval (refer to FIG. 9C). In the compression interval, the gain controller 130 may output, as the digital gain DG, the compressed gain CG provided from the compressor 150.

On the other hand, with regard to the digital input DI having a peak level which is less than −40 dBFS, the compressor 150 may not compress the digital gain DG. In the non-compression interval, the gain controller 130 may control generating the digital gain DG without gain compression, such that the digital gain DG increases by a quantity by which a peak level of the digital input DI decreases.

For example, referring to FIGS. 9A and 9B, in the non-compression interval, a ratio of an increment of the digital gain DG to a decrement of a peak level of the digital input DI may be the same as a reference ratio, e.g., 1:1 (i.e., while a peak level of the digital input DI decreases by one unit magnitude, the digital gain DG also increases by one unit magnitude). For example, this ratio may be selected such that a target level of the digital output DO is constantly maintained in the non-compression interval (refer to FIG. 9C). In the non-compression interval, the gain controller 130 may output the digital gain DG without the compressed gain CG.

Compared with FIG. 6B, it may be understood that, in the compression interval of FIG. 9B, a rate of increase in the digital gain DG is compressed, For example, the compressor 150 may generate the compressed gain CG such that a ratio of an increment of the digital gain DG to a decrement of a peak level of the digital input DI is less than the reference ratio (e.g., 1:1) in the compression interval. For example, the compressor 150 may generate the compressed gain CG such that a ratio of an increment of the digital gain DG to a decrement of a peak level of the digital input DI in the compression interval is less than a ratio of an increment of the digital gain DG to a decrement of a peak level of the digital input DI in the non-compression interval.

Referring to FIG. 9B, the digital gain DG may increase as a peak level of the digital input DI decreases, in the compression interval and the non-compression interval. Accordingly, referring to FIGS. 9A and 9C, a peak level of the digital input DI may increase to a target level of the digital output DO based on the digital gain DG, in the compression interval and the non-compression interval. For example, in the compression interval, a target level of the digital output DO may increase as a peak level of the digital input DI increases. For example, in the non-compression interval, a target level of the digital output DO may be constantly maintained.

Compared with FIG. 6B, an increment of the digital gain DG in the example of FIG. 9B may be relatively small. Accordingly, referring to FIGS. 9A and 9C, a target level of the digital output DO may be less than the maximum level which is allowable in the digital domain, and thus there may be a margin between the target level and the maximum level. In this case, even though a signal level of the digital input DI varies sharply or quickly, there may be prevented a case where the target level of the digital output DO exceeds the maximum level (refer to FIG. 7).

The compressor 150 may include a hardware circuit configured to perform the gain compression. For example, the hardware circuit of the compressor 150 may include a memory (e.g., a register) for storing relevant information such as a threshold level, a compression ratio, and/or the like. The information stored in the memory may be fixed or may be revisable. In addition, the hardware circuit of the compressor 150 may be variously implemented to provide the gain compression of FIG. 9B.

For example, the compressor 150 may include a hard-wired circuit configured to perform an arithmetic operation (e.g., $DG=0.5*|DI|$ where $-40 \leq DI \leq 0$, and $DG=|DI|-20$ where $DI<-40$) corresponding to the graph of FIG. 9B. For example, the compressor 150 may include a memory for storing information of the table of FIG. 9A and an interpolator circuit for calculating a value which is not indicated by the table of FIG. 9A. For example, the compressor 150 may include a reconfigurable circuit for performing an operation flexibly based on the information stored in the memory.

However, the above examples are provided to facilitate better understanding, and are not intended to limit example embodiments. Other components (e.g., the peak detector 110, the gain controller 130, and components to be described below) of the output gain controller circuit 100 as well as the compressor 150 may be variously implemented with hardware circuits configured to perform operations which are described above and to be described below. In some cases, some functions of the peak detector 110, the gain controller 130, and the compressor 150 may be implemented in an instruction set of a program code so as to be processed by a processor core.

Figures 10A, 10B:
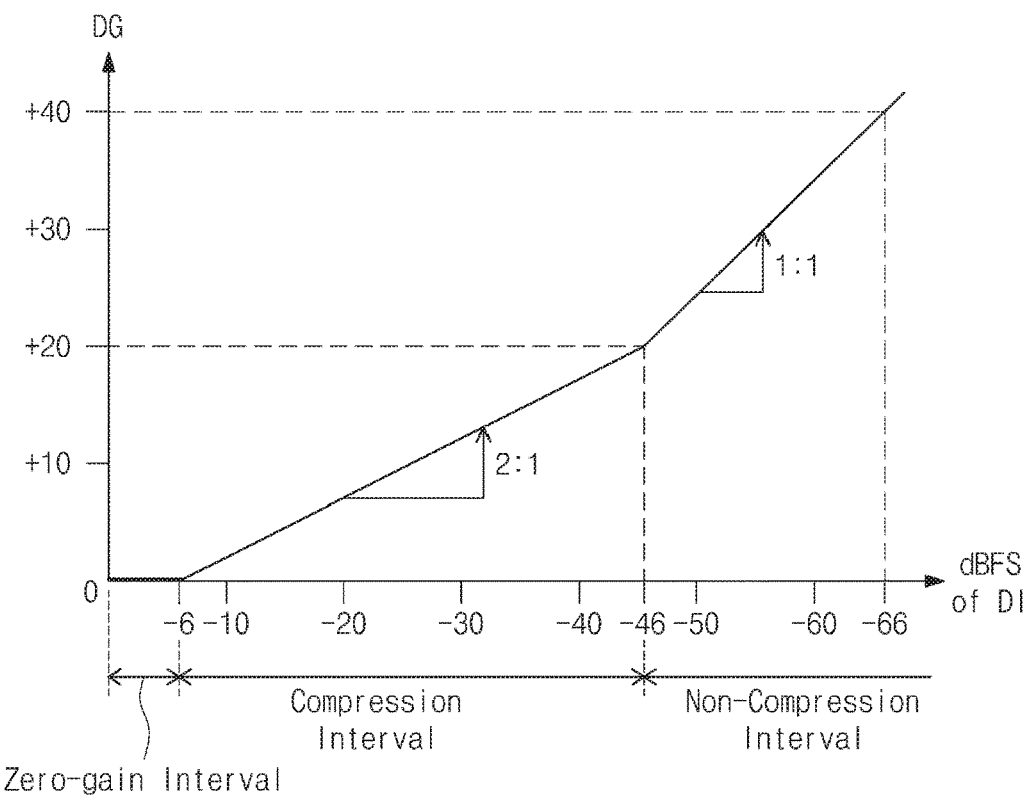
Figure 10C:
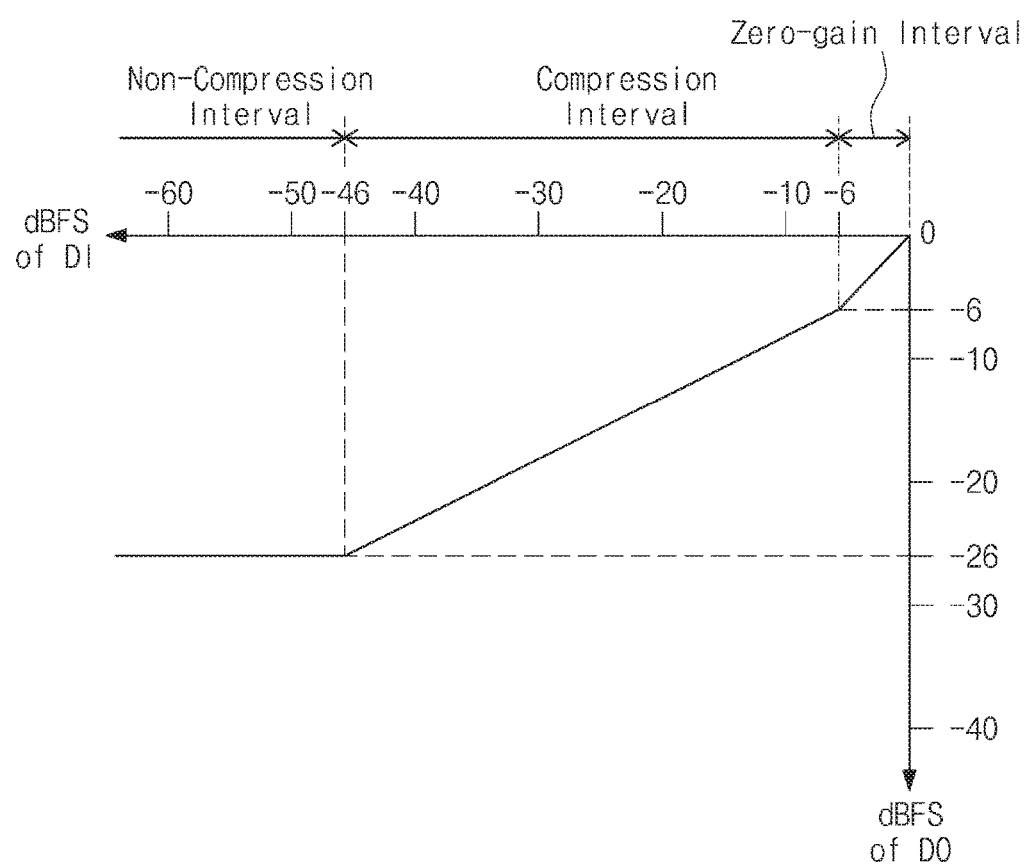

FIGS. 10A to 10C are a table and graphs for describing example gain control and gain compression which is performed by the output gain controller circuit 100a of FIG. 8.

Referring to FIGS. 10A to 10C, FIGS. 10A to IOC illustrates an example where a threshold level of the compressor 150 is −46 dBFS and a compression ratio of the compressor 150 is 2:1. In this example, the compressor 150 may compress an input level exceeding −46 dBFS according to the compression ratio of 2:1. However, this example is provided to facilitate better understanding, and is not intended to limit example embodiments.

Comparing the example of FIGS. 10A to 10C to the example of FIGS. 9A to 9C, there may be a difference in a threshold level of the compressor 150, but other conditions may be the same. Accordingly, a compression interval and a non-compression interval associated with the example of FIGS. 10A to 10C may be substantially the same as or similar to those described with reference to FIGS. 9A to 9C.

However, as the threshold level of the compressor 150 is changed, there may be a zero-gain interval where the digital gain DG is zero. For example, referring to FIGS. 10A and 10B, as a peak level of the digital input DI increases and the digital gain DG decreases in the compression interval, the digital gain DG may become zero when the peak level of the digital input DI is −6 dBFS. Accordingly, the digital gain DG may be zero in the zero-gain interval where the peak level of the digital input DI is greater than −6 dBFS.

Example embodiments may be provided to improve an SNR characteristic and a dynamic range characteristic by boosting a peak level of the digital input DI. Accordingly, the digital gain DG may not have a negative value.

Referring to FIGS. 10A and 10C, in the zero-gain interval, a peak level of the digital input DI may be the same as a target level of the digital output DO. Meanwhile, in the zero-gain interval, an increment of the digital gain DG may not be compressed. Accordingly, a ratio of an increment of a target level of the digital output DO to an increment of a peak level of the digital input DI in the compression interval may be less than a ratio of an increment of a target level of the digital output DO to an increment of a peak level of the digital input DI in the zero-gain interval.

IV. Gain Control Using Reference Gain

Figure 11:
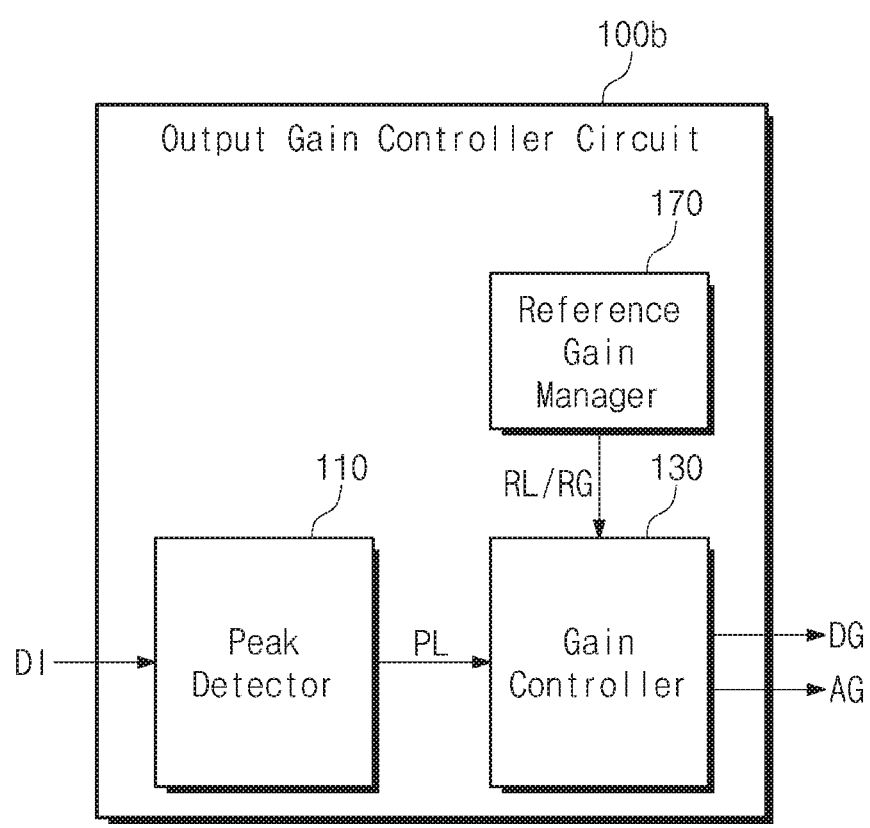
FIG. 11 is a block diagram illustrating an example configuration of an output gain controller circuit of FIG. 3 according to some example embodiments.

FIG. 11 is a block diagram illustrating an example configuration of the output gain controller circuit 100 of FIG. 3 according to some example embodiments.

In some example embodiments, the output gain controller circuit 100 of FIG. 3 may include an output gain controller circuit 100b of FIG. 11. For example, the output gain controller circuit 100b may include the peak detector 110, the gain controller 130, and a reference gain manager 170. The peak detector 110 and the gain controller 130 may be configured and may operate to be substantially the same as or similar to those described with reference to FIG. 8, and thus redundant description will be omitted below.

In the example embodiment of FIG. 11, the gain controller 130 may output the digital gain DG and the analog gain AG based on a peak level PL which is detected by the peak detector 110. In addition, the gain controller 130 may output the digital gain DG and the analog gain AG based on a reference level RL and a reference gain RG which are provided from the reference gain manager 170. For example, the reference gain manager 170 may include a memory for storing the reference level RL and the reference gain RG. The reference level RL and/or the reference gain RG may be fixed or variable.

As described with reference to FIGS. 5 to 6C, in some cases, a target level of the digital output DO may be selected to have the maximum level which is allowable in the digital domain. However, various noises (e.g., a thermal noise and the like) may occur due to a process/device characteristic.

When a signal level of the final analog output AO2 of a specific time point is somewhat small, this small signal level may be greatly affected by a noise. Accordingly, even though gain control is maximally performed such that a target level of the digital output DO has the maximum level, a disadvantage due to a noise may be greater than an advantage of expansion of a dynamic range obtained from the gain control. In this case, performing the gain control maximally may be inefficient.

The reference level RL and the reference gain RG may be selected taking into account the amount or intensity of a noise. For example, the reference level RL and the reference gain RG may be selected taking into account a trade-off point between an advantage of expansion of a dynamic range and a disadvantage due to a noise. In some example embodiments, the gain controller 130 may differently perform the gain control based on a magnitude relationship between the reference level RL and the reference gain RG.

Figure 12:
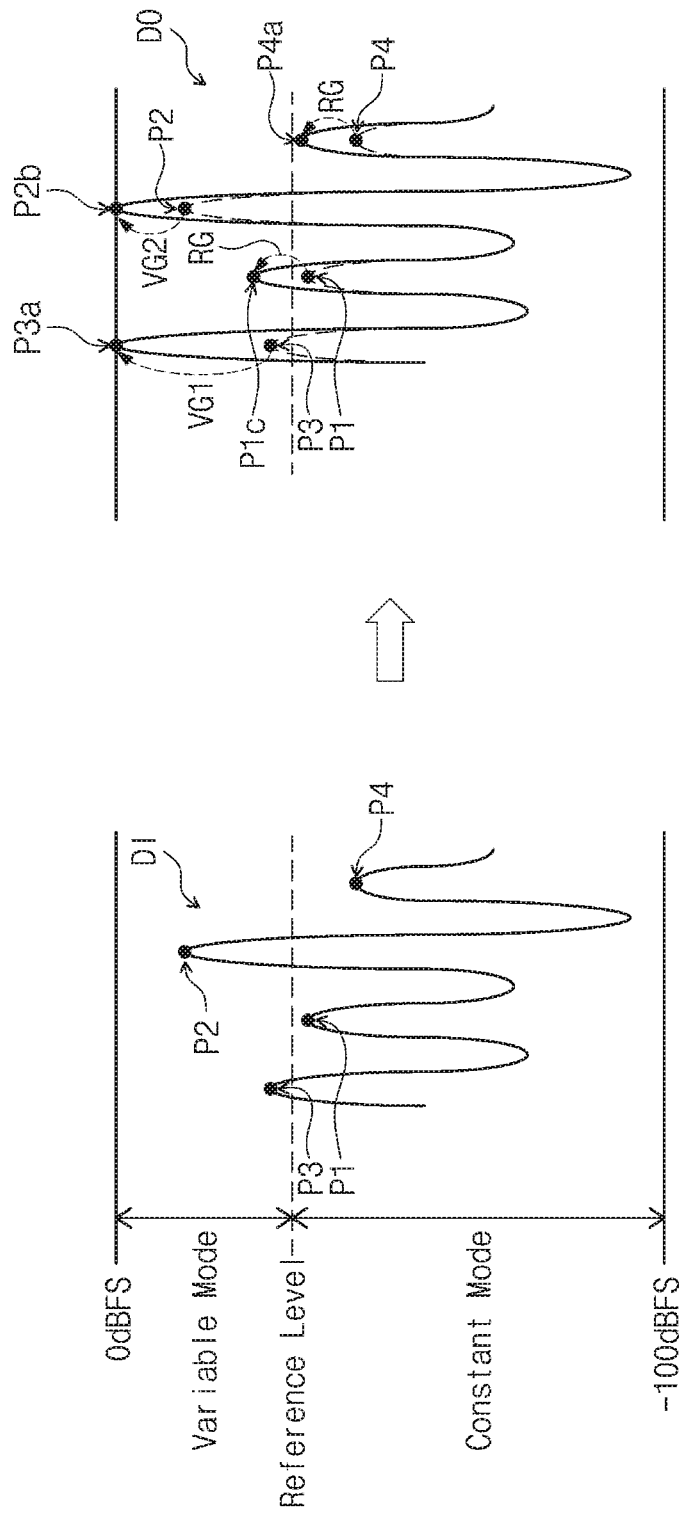
FIG. 12 is a conceptual diagram for describing example gain control which is performed by an output gain controller circuit of FIG. 11.

FIG. 12 is a conceptual diagram for describing example gain control which is performed by the output gain controller circuit 100b of FIG. 11.

For example, the digital input Di may include peak levels P1 to P4. Meanwhile, the peak levels P1 and P4 may be lower than a reference level, and the peak levels P2 and P3 may be higher than the reference level.

The gain controller 130 may provide gain control of a constant mode with regard to the peak levels P1 and P4. In the constant mode, the gain controller 130 may increase the peak levels P1 and P4 by a constant reference gain RG. For example, the peak level P1 may increase to a target level P1c of the digital output DO based on the reference gain RG, and the peak level P4 may increase to a target level P4a of the digital output DO based on the reference gain RG. That is, in the constant mode, the digital gain DG may constantly have the reference gain RG.

As described above, a small signal level may be greatly affected by a noise. For this reason, excessively boosting the peak levels P1 and P4 which are less than the reference level RL may be inefficient because of a disadvantage due to a thermal noise. Accordingly, the peak levels P1 and P4 may be boosted only by the reference gain RG. According to this example embodiment, efficiency of gain control and power management may be improved.

Meanwhile, the gain controller 130 may provide gain control of a variable mode with regard to the peak levels P2 and P3. In the variable mode, the gain controller 130 may increase the peak levels P2 and P3 by variable gains VG1 and VG2. For example, the peak level P3 may increase to a target level P3a of the digital output DO based on the variable gain VG1, and the peak level P2 may increase to a target level P2b of the digital output DO based on the variable gain VG2.

For example, each of the target levels P2b and P3a may be selected to have the maximum level which is allowable in the digital domain. That is, in the variable mode, the digital gain DG may vary depending on a peak level. The peak levels P2 and P3 which are greater than the reference level RL may be relatively less affected by a noise. Accordingly, boosting the peak levels P2 and P3 to the maximum level may be helpful to improve a dynamic range characteristic.

Figures 13A, 13B:
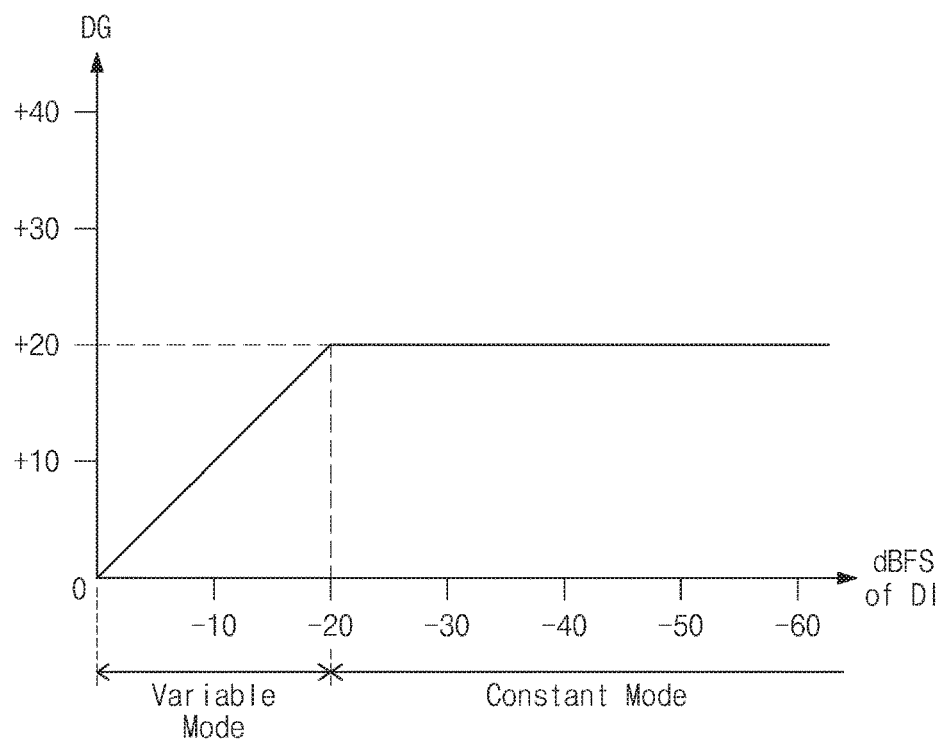
FIGS. 13A to 13C are a table and graphs for more fully describing example gain control of FIGS. 11 and 12.
Figure 13C:
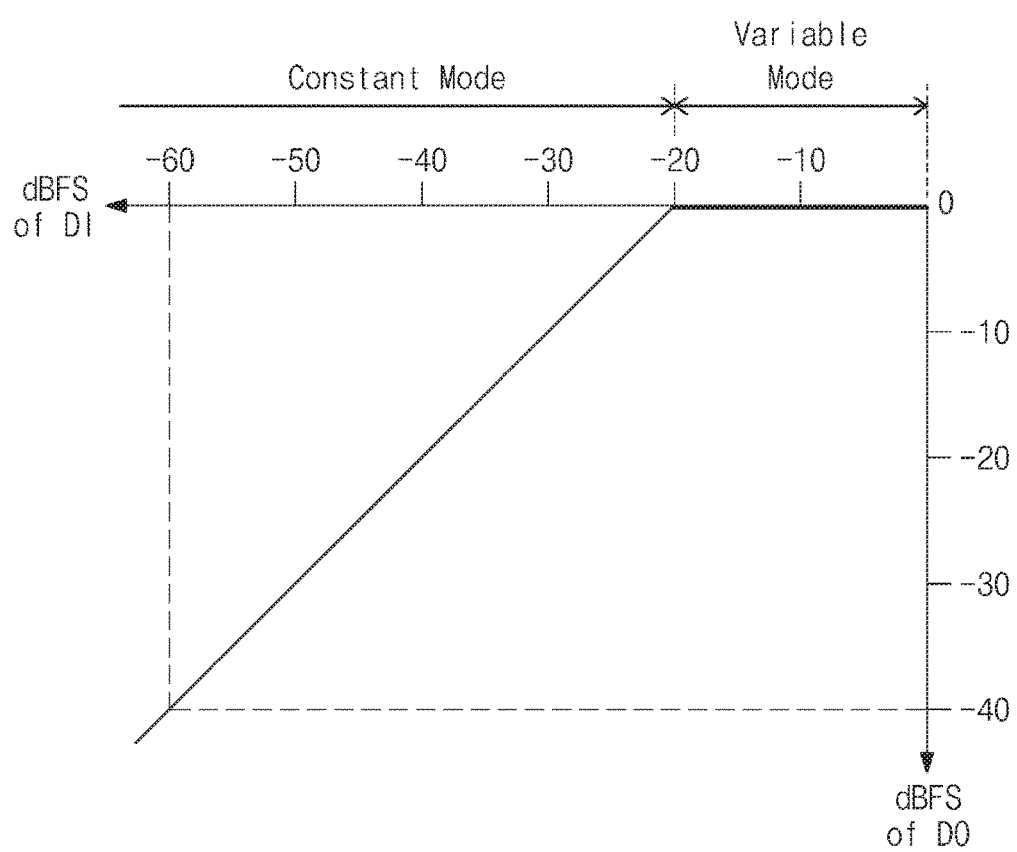

FIGS. 13A to 13C are a table and graphs for more fully describing the example gain control of FIGS. 11 and 12.

Referring to FIGS. 13A to 13C, FIGS. 13A to 13C illustrates an example of a case where a reference RL is −20 dBFS and a reference gain RG is +20 dBFS. In this example, the gain controller 130 may increase a peak level which is less than −20 dBFS by 20 dBFS. However, this example is provided to facilitate better understanding, and is not intended to limit example embodiments. The reference level RL and the reference gain RG may be variously changed or modified depending on implementation of the reference gain manager 170 and the output gain controller circuit 100a.

The table of FIG. 13A illustrates an example relationship between a peak level of the digital input DI, the digital gain DG, and a target level of the digital output DO. Further, the table of FIG. 13A additionally illustrates an example relationship associated with the analog gain AG and a signal level of the final analog output AO2. However, the example relationship associated with the analog gain AG and the signal level of the final analog output AO2 may be substantially the same as or similar to that described with reference to FIG. 6A, and thus redundant description will be omitted below.

The graph of FIG. 13B illustrates a relationship between a peak level of the digital input DI and the digital gain DG in the table of FIG. 13A. The graph of FIG. 13C illustrates a relationship between a peak level of the digital input DI and a target level of the digital output DO in the table of FIG. 13A.

Referring to FIGS. 13A and 13B, in a constant mode interval where a peak level of the digital input DI is less than the reference level RL, the digital gain DG may constantly have the reference gain RG. On the other hand, in a variable mode interval where a peak level of the digital input DI is greater than the reference level RL, the digital gain DG may vary depending on the peak level of the digital input DI. For example, when a target level of the digital output DO is selected to have the maximum level which is allowable in the digital domain, a ratio of an increment of the digital gain DG to a decrement of the peak level of the digital input DI in the variable mode interval may be the same as the reference ratio (e.g., 1:1).

Referring to FIGS. 13A and 13C, in the variable mode interval, a target level of the digital output DO may constantly have the maximum level. On the other hand, in the constant mode interval, a target level of the digital output DO may increase as a peak level of the digital input DI increases. For example, in the constant mode interval, a target level of the digital output DO may increase by a quantity by which a peak level of the digital input DI increases.

V. Gain Control Based on Gain Compression and Reference Gain

Figure 14:
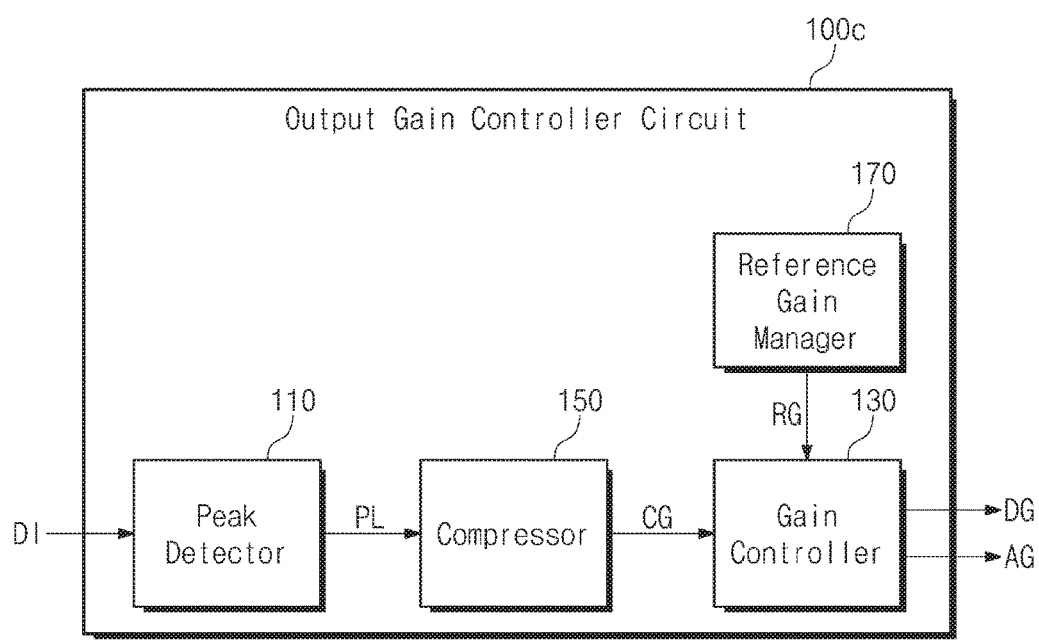
FIG. 14 is a block diagram illustrating an example configuration of an output gain controller circuit of FIG. 3 according to some example embodiments.

FIG. 14 is a block diagram illustrating an example configuration of the output gain controller circuit 100 of FIG. 3 according to some example embodiments.

In some example embodiments, the output gain controller circuit 100 of FIG. 3 may include an output gain controller circuit 100c of FIG. 14. For example, the output gain controller circuit 100c may include the peak detector 110, the gain controller 130, the compressor 150, and the reference gain manager 170. The peak detector 110, the gain controller 130, the compressor 150, and the reference gain manager 170 may be configured and may operate to be substantially the same as or similar to those described with reference to FIGS. 8 and 11, and thus redundant description will be omitted below.

The output gain controller circuit 100c may employ the operations of the output gain controller circuit 100c of FIG. 11 together with the operations of the output gain controller circuit 100a of FIG. 8. For example, when a peak level of the digital input DI is higher than a threshold level of the compressor 150, a rate of increase in the digital gain DG may be compressed. On the other hand, when a peak level of the digital input DI is lower than the threshold level of the compressor 150, the digital gain DG may constantly have the reference gain RG. Meanwhile, there may be a zero-gain interval where the digital gain DG becomes zero, depending on the threshold level of the compressor 150.

Figure 15B:
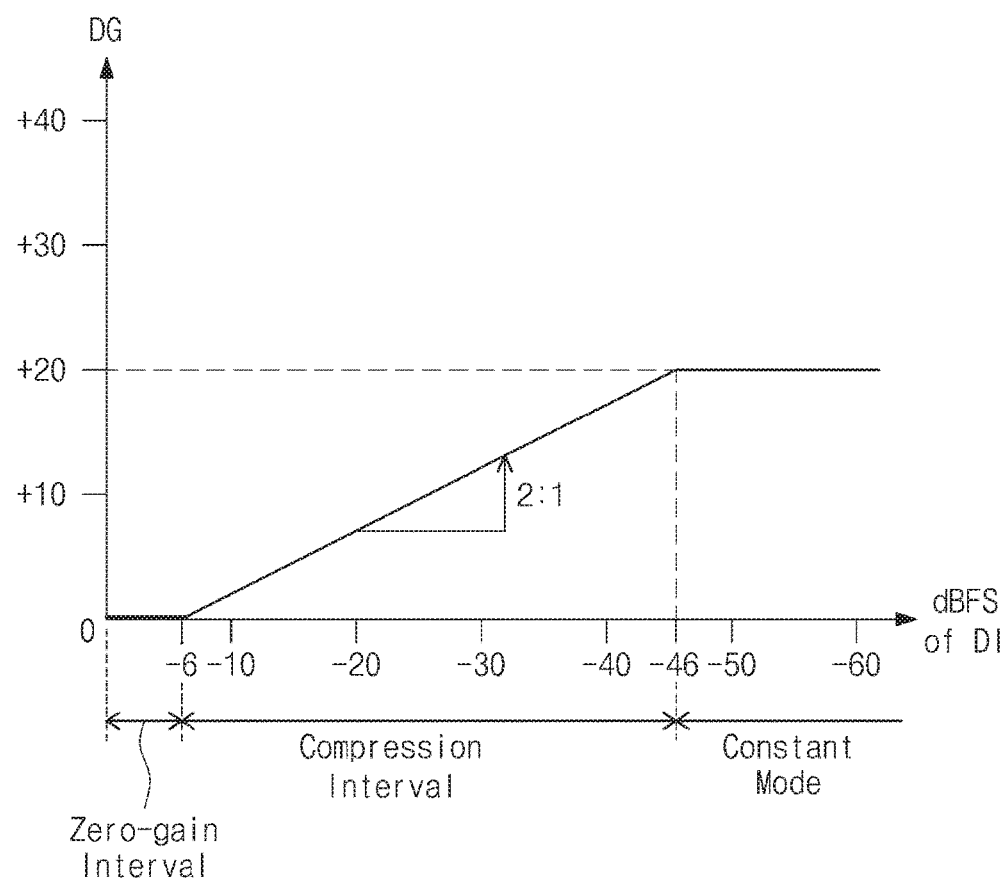
Figure 15C:
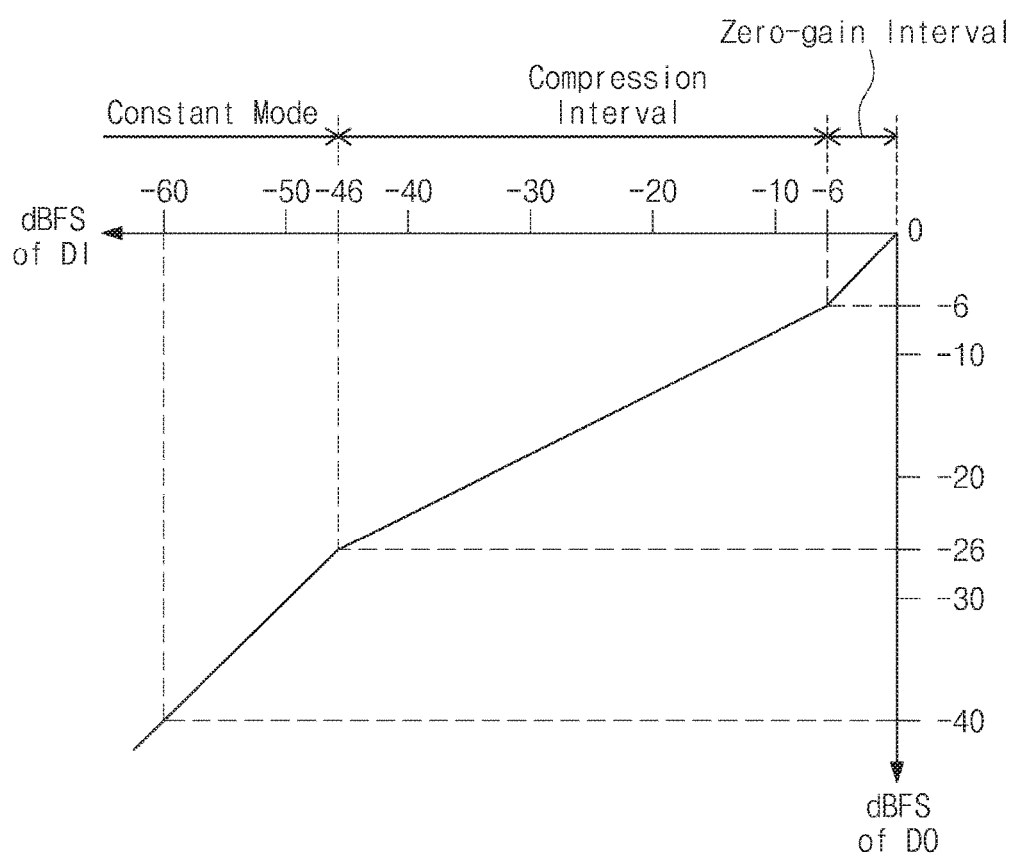

FIGS. 15A to 15C are a table and graphs for describing example gain control and gain compression which is performed by the output gain controller circuit 100c of FIG. 14.

FIGS. 15A to 15C illustrates an example of a case where a threshold level of the compressor 150 is −46 dBFS, a compression ratio of the compressor 150 is 2:1, and the reference gain RG is +20 dBFS. In this example, the compressor 150 may compress an input level exceeding −46 dBFS according to the compression ratio of 2:1, and the gain controller 130 may increase a peak level which is less than −46 dBFS by 20 dBFS. However, this example is provided to facilitate better understanding, and is not intended to limit example embodiments. The threshold level, the compression ratio, and the reference gain RG may be variously changed or modified depending on implementation of the compressor 150, the reference gain manager 170, and the output gain controller circuit 100c.

The table of FIG. 15A illustrates an example relationship between a peak level of the digital input DI, the digital gain DG, and a target level of the digital output DO. Further, the table of FIG. 15A additionally illustrates an example relationship associated with the analog gain AG and a signal level of the final analog output AO2. However, the example relationship associated with the analog gain AG and the signal level of the final analog output AO2 may be substantially the same as or similar to that described with reference to FIG. 6A, and thus redundant description will be omitted below.

The graph of FIG. 15B illustrates a relationship between a peak level of the digital input DI and the digital gain DG in the table of FIG. 15A. The graph of FIG. 15C illustrates a relationship between a peak level of the digital input DI and a target level of the digital output DO in the table of FIG. 15A.

The compressor 150 may receive a peak level of the digital input DI as an input level. Referring to FIG. 15B, an interval where a peak level of the digital input DI is greater than −46 dBFS may be a compression interval where an input level s compressed by the compressor 150. On the other hand, an interval where a peak level of the digital input DI is less than −46 dBFS may be a constant mode interval where the compressor 150 does not operate and the digital gain DG is constantly maintained.

With regard to the digital input DI having a peak level which exceeds −46 dBFS, the compressor 150 may output the digital gain DG which is compressed according to the compression ratio of 2:1, i.e., may output the compressed gain CG. In the compression interval, the compressor 150 may generate the compressed gain CG such that the digital gain DG increases by a quantity which is less than a quantity by which a peak level of the digital input DI decreases. For example, the compressor 150 may generate the compressed gain CG such that a ratio of an increment of the digital gain DG to a decrement of a peak level of the digital input DI in the compression interval is less than the reference ratio (e.g., 1:1).

For example, referring to FIGS. 15A and 15B, in the compression interval, a ratio of an increment of the digital gain DG to a decrement of a peak level of the digital input DI may be 2:1 (i.e., while a peak level of the digital input DI decreases by two unit magnitudes, the digital gain DG increases by one unit magnitude). For example, this ratio may be selected such that a target level of the digital output DO increases as a peak level of the digital input DI increases in the compression interval (refer to FIG. 15C). In the compression interval, the gain controller 130 may output, as the digital gain DG, the compressed gain CG which is provided from the compressor 150.

On the other hand, with regard to the digital input DI having a peak level which is less than −46 dBFS, the compressor 150 may not operate. Instead, in the constant mode interval, the gain controller 130 may control generating the digital gain DG such that the digital gain DG constantly has the reference gain RG. Accordingly, the gain controller 130 may output the digital gain DG which is generated to have the reference gain RG without gain compression.

Referring to FIG. 15B, in the compression interval, the digital gain DG may increase as a peak level of the digital input DI decreases. Accordingly, referring to FIGS, 15A and 15C, a peak level of the digital input DI may increase to a target level of the digital output DO based on the digital gain DG, in the compression interval. For example, in the compression interval, a target level of the digital output DO may increase as a peak level of the digital input DI increases.

Meanwhile, in the constant mode interval, a target level of the digital output DO may increase as a peak level of the digital input DI increases. For example, in the constant mode interval, a target level of the digital output DO may increase by a quantity by which a peak level of the digital input DI increases.

There may be a zero-gain interval where the digital gain DG becomes zero, depending on the threshold level of the compressor 150. For example, referring to FIGS. 15A and 15B, as a peak level of the digital input DI increases and the digital gain DG decreases in the compression interval, the digital gain DG may become zero when the peak level of the digital input Di is −6 dBFS. Accordingly, the digital gain DG may be zero in the zero-gain interval where the peak level of the digital input DI is greater than −6 dBFS.

In the zero-gain interval, a peak level of the digital input DI may be the same as a target level of the digital output DO. Meanwhile, in the zero-gain interval, a rate of increase in the digital gain DG may not be compressed. Accordingly, a ratio of an increment of a target level of the digital output DO to an increment of a peak level of the digital input DI in the compression interval may be less than a ratio of an increment of the target level of the digital output DO to an increment of the peak level of the digital input DI in the zero-gain interval.

Figure 16:
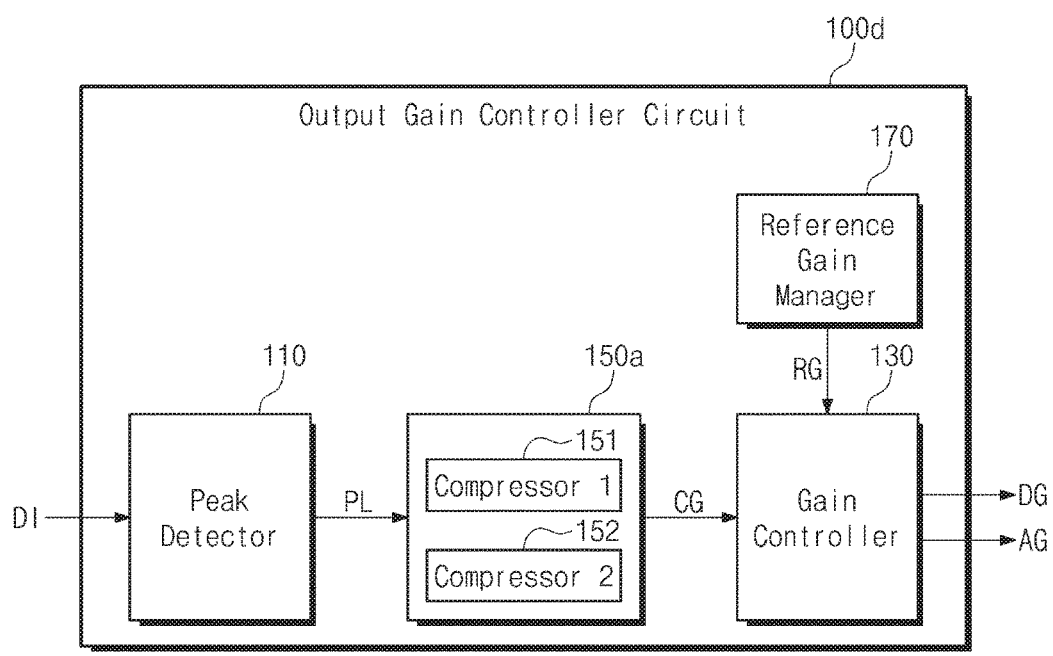
FIG. 16 is a block diagram illustrating an example configuration of an output gain controller circuit of FIG. 3 according to some example embodiments.

FIG. 16 is a block diagram illustrating an example configuration of the output gain controller circuit 100 of FIG. 3 according to some example embodiments.

In some example embodiments, the output gain controller circuit 100 of FIG. 3 may include an output gain controller circuit 100d of FIG. 16. For example, the output gain controller circuit 100d. may include the peak detector 110, the gain controller 130, a compressor block 150a, and the reference gain manager 170. The peak detector 110, the gain controller 130, and the reference gain manager 170 may be configured and may operate to be substantially same as or similar to those described with reference to FIGS. 8, 11, and 14, and thus redundant description will be omitted below.

The compressor block 150a may include two compressors 151 and 152. Each of the compressors 151 and 152 may be configured and may operate to be substantially the same as or similar to the compressor 150 described with reference to FIGS. 8 and 14. However, the compressors 151 and 152 may operate based on different threshold levels and different compression ratios, and thus, the compressor block 150a may provide two threshold levels and two compression ratios.

Figure 17B:
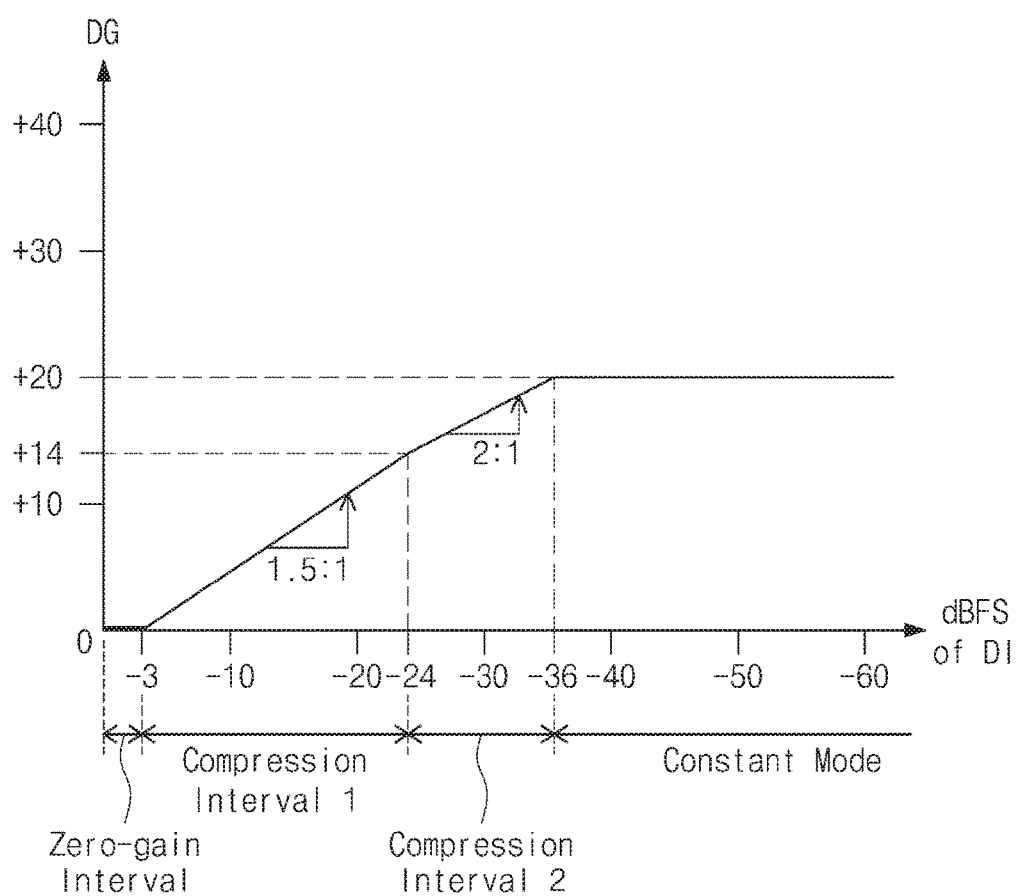
Figure 17C:
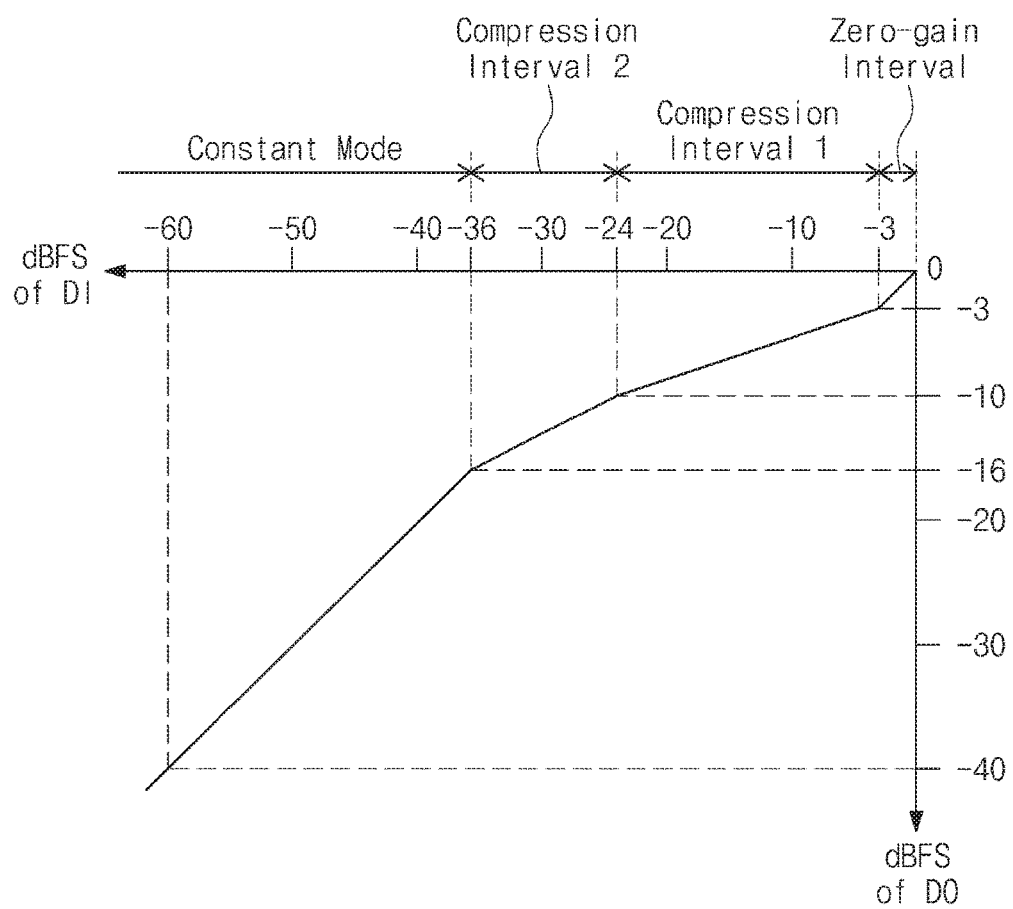

FIGS. 17A to 17C are a table and graphs for describing example gain control and gain compression which is performed by the output gain controller circuit 100d of FIG. 16.

In an example of FIGS. 17A to 17C, a first threshold level may be −36 dBFS, and a first compression ratio may be 2:1. A second threshold level may be −24 dBFS, and a second compression ratio may be 1.5:1. Meanwhile, the reference gain RG may be +20dBFS. However, this example is provided to facilitate better understanding, and is not intended to limit example embodiments. The threshold levels, the compression ratios, and the reference gain RG may be variously changed or modified depending on implementation of the compressor block 150a, the reference gain manager 70, and the output gain controller circuit 100d.

The table of FIG. 17A illustrates an example relationship between a peak level of the digital input DI, the digital gain DG, and a target level of the digital output DO. Further, the table of FIG. 17A additionally illustrates an example relationship associated with the analog gain AG and a signal level of the final analog output AO2. However, the example relationship associated with the analog gain AG and the signal level of the final analog output AO2 may be substantially the same as or similar to that described with reference to FIG. 6A, and thus redundant description will be omitted below.

The graph of FIG. 17B illustrates a relationship between a peak level of the digital input and the digital gain DG in the table of FIG. 17A. The graph of FIG. 17C illustrates a relationship between a peak level of the digital input DI and a target level of the digital output DO in the table of FIG. 17A.

Referring to FIGS. 17B and 17C, an interval where a peak level of the digital input DI is greater than −24 dBFS may be a first compression interval where an input level is compressed by the compressor block 150a according to the compression ratio of 1.5:1. An interval where a peak level of the digital input DI is less than −24 dBFS and greater than −36 dBFS may be a second compression interval where an input level is compressed by the compressor block 150a according to the compression ratio of 2:1. Meanwhile, an interval where a peak level of the digital input DI is less than −36 dBFS may be a constant mode interval where the compressor block 150 does not operate and the digital gain DG is constantly maintained.

In the first compression interval and in the second compression interval, the digital gain DG may increase as a peak level of the digital input DI decreases. A first ratio of an increment of the digital gain DG to a decrement of a peak level of the digital input DI in the first compression interval is less than the reference ratio (e.g., 1:1). A second ratio of an increment of the digital gain DG to a decrement of a peak level of the digital input DI in the second compression interval is less than the reference ratio. In some example embodiments, the first ratio may be different from the second ratio.

The first compression interval and the second compression interval may be substantially the same as or similar to the compression interval described with reference to FIGS. 15A to 15C. The constant mode interval may be substantially the same as or similar to the constant mode interval described with reference to FIGS. 15A to 15C. In some cases, there may be a zero-gain interval where the digital gain DG is zero. The zero-gain interval may be substantially the same as or similar to the zero-gain interval described with reference to FIGS. 15A to 15C. Accordingly, redundant description will be omitted below.

FIGS. 16 to 17C are associated with the two compressors 151 and 152, but example embodiments are not limited thereto. In some example embodiments, the output gain controller circuit 100d may be implemented to include three or more compressors.

VI. Additional Configuration

Figure 18:
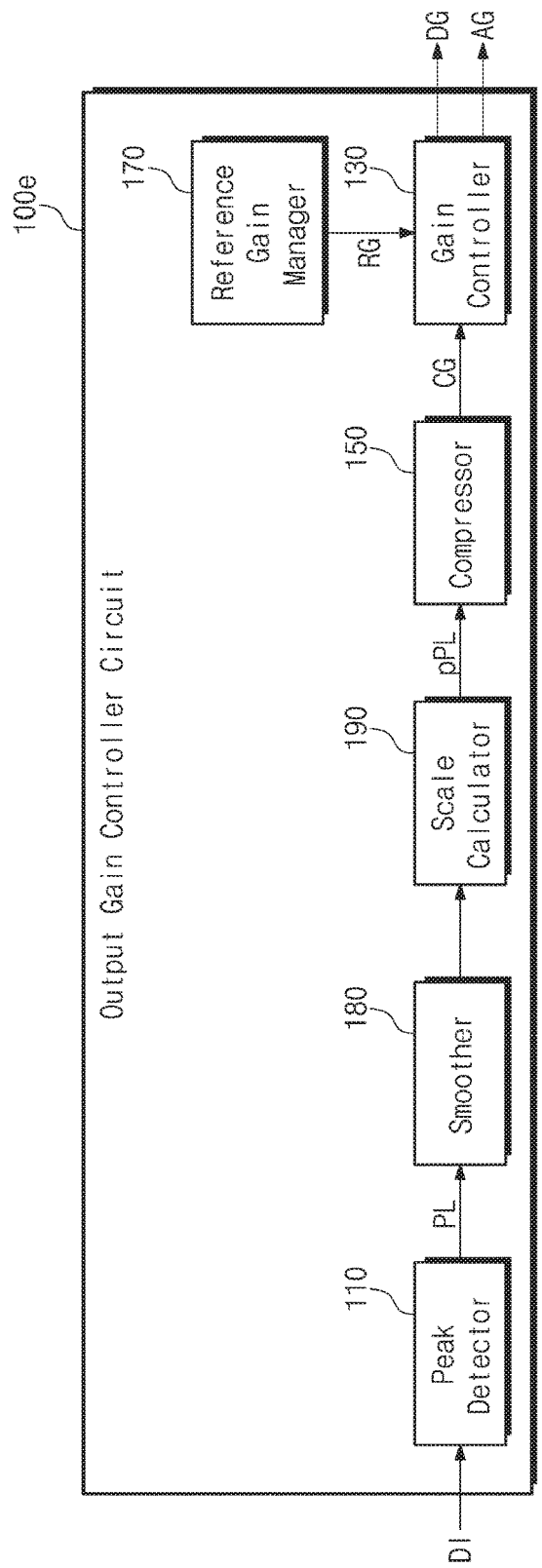
FIG. 18 is a block diagram illustrating an example configuration of an output gain controller circuit of FIG. 3 according to some example embodiments.

FIG. 18 is a block diagram illustrating an example configuration of the output gain controller circuit 100 of FIG. 3 according to some example embodiments.

In some example embodiments, the output gain controller circuit 100 of FIG. 3 may include an output gain controller circuit 100e of FIG. 18. For example, the output gain controller circuit 100e may include the peak detector 110, the gain controller 130, the compressor 150, the reference gain manager 170, a smoother 180, and a scale calculator 190. The peak detector 110, the gain controller 130, the compressor 150, and the reference gain manager 170 may be configured and may operate to be substantially the same as or similar to those described with reference to FIGS. 8, 11, and 14, and thus redundant description will be omitted below.

The smoother 180 may stabilize a change in a peak level detected by the peak detector 110. The smoother 180 may generate a stabilized peak level. For example, when the peak level PL varies sharply or quickly, it may be difficult to stably track the peak level PL. Accordingly, the smoother 180 may post-process the peak level PL such that the peak level PL stably varies.

The scale calculator 190 may receive the stabilized peak level from the smoother 180. The scale calculator 190 may convert the stabilized peak level to a value pPL of a reference scale. For example, the reference scale may include a unit of dbFS. The scale calculator 190 may provide scale conversion such that a signal level processed in the output gain controller circuit 100e is easily understood.

In the example embodiment of FIG. 18, the compressor 150 may operate based on the value pPL of the reference scale, instead of operating based on the peak level PL. In this case, it may be understood that examples described with reference to FIGS. 3 to 17C are intuitively applied.

While some example embodiments have been described, it will be apparent o those skilled in the art that various changes and modifications may be made without departing from the spirit and scope of the example embodiments. Therefore, it should be understood that the above example embodiments are not limiting, but illustrative.

What is claimed is:

1. An electronic circuit comprising:
 a peak detector configured to,
  detect a signal level from a digital input, the digital input being in a digital domain, and
  detect a peak level of the digital input as a point where the signal level switches from increasing to decreasing;
 a gain controller configured to,
  set a maximum level of the digital input that is allowable in the digital domain,
  determine a target level of the digital input such that the target level is greater than the peak level of the digital input and is less than or equal to the maximum level allowable in the digital domain,
  set a digital gain based on a compressed gain such that the digital gain increases the peak level of the digital input to the target level, and
  increase, in a compression interval where the peak level is greater than a threshold level, the digital gain as the peak level decreases; and
 a compressor configured to set the compressed gain based on the peak level such that, in the compression interval, a ratio of an increment of the digital gain to a decrement of the peak level is less than a reference ratio.

2. The electronic circuit of claim 1, wherein the peak detector is further configured to,
 detect the signal level from the digital input in each sampling period.

3. The electronic circuit of claim 1, wherein the digital gain corresponds to a difference between the peak level and the target level.

4. The electronic circuit of claim 1, wherein the reference ratio corresponds to a ratio of an increment of the digital gain to a decrement of the peak level, if the digital gain increases by a same amount that the peak level decreases.

5. The electronic circuit of claim 1, wherein
 in a non-compression interval where the peak level is less than the threshold level, the digital gain increases as the peak level decreases, and
 the gain controller is further configured to control generating the digital gain such that a ratio of an increment of the digital gain to a decrement of the peak level in the non-compression interval equals the reference ratio.

6. The electronic circuit of claim 1, wherein the gain controller is further configured to control generating the digital gain such that the digital gain has a reference gain in a constant mode interval, the constant mode interval being an interval where the peak level is less than the threshold level.

7. The electronic circuit of claim 6, wherein the gain controller is further configured to,
 output, in the compression interval, the compressed gain as the digital gain; and
 output, in the constant mode interval, the reference gain as the digital gain.

8. The electronic circuit of claim 6, wherein, in the compression interval and the constant mode interval, the target level increases as the peak level increases.

9. The electronic circuit of claim 1, wherein, in a zero-gain interval where the digital gain is zero as the peak level increases and the digital gain decreases in the compression interval, the peak level equals the target level.

10. An electronic circuit comprising:
a peak detector configured to,
   detect a signal level from a digital input, the digital input being in a digital domain, and
   detect a peak level of the digital input as a point where the signal level switches from increasing to decreasing;
a gain controller configured to,
   set a maximum level of the digital input that is allowable in the digital domain,
   determine a target level for the digital input such that the target level is greater than the peak level of the digital input and is less than or equal to the maximum level allowable in the digital domain,
   set a digital gain based on a compressed gain such that the digital gain increases the peak level to the target level, and
   increase the digital gain as the peak level decreases; and
a compressor configured to set the compressed gain based on the peak level such that a first ratio in a first interval is less than a second ratio in a second interval, wherein
   the first interval is an interval where the peak level is greater than a threshold level, and the second interval is an interval where the peak level is less than the threshold level, and
   the first ratio is a ratio of an increment of the digital gain to a decrement of the peak level in the first interval, and the second ratio is a ratio of an increment of the digital gain to a decrement of the peak level in the second interval.

11. The electronic circuit of claim 10, wherein the compressor is further configured to set the compressed gain in the first interval such that, when the peak level decreases in the first interval, an increase in the digital gain is less than a decrease in the peak level.

12. The electronic circuit of claim 10, wherein the gain controller is further configured to control generating the digital gain in the second interval such that, when the peak level decreases in the second interval, the digital gain increases by a same amount as the peak level decreases.

13. The electronic circuit of claim 12, wherein the gain controller is further configured to:
   output, in the first interval, the compressed gain as the digital gain, and
   output, in the second interval, the digital gain directly to the gain controller.

14. The electronic circuit of claim 10, wherein the gain controller is configured to set the digital gain based on the first ratio in the first interval such that the target level increases as the peak level increases in the first interval.

15. The electronic circuit of claim 10, wherein the gain controller is configured to set the digital gain based on the second ratio in the second interval such that the target level is constantly maintained in the second interval.

16. The electronic circuit of claim 10, wherein, in a zero-gain interval where the digital gain is zero as the peak level increases and the digital gain decreases in the first interval, the peak level equals the target level.

17. An electronic device comprising:
a memory configured to store data associated with a digital input, the digital input being in a digital domain; and
an output gain controller circuit configured to,
   detect a signal level from the digital input,
   detect a peak level of the digital input as a point where the signal level switches from increasing to decreasing,
   set a maximum level of the digital input that is allowable in the digital domain,
   determine a target level for the digital input such that the target level is greater than the peak level of the digital input and is less than or equal to the maximum level allowable in the digital domain, and
   set a digital gain such that the electronic device increases the peak level of the digital input to the target level based on the digital gain, wherein
   in a compression interval where the peak level is greater than a threshold level, the output gain controller circuit is configured to increase the digital gain as the peak level decreases such that a ratio of an increment of the digital gain to a decrement of the peak level in the compression interval is less than a reference ratio.

18. The electronic device of claim 17, wherein the electronic device is configured to generate a digital output by increasing the digital input to the target level based on the digital gain, and the output gain controller circuit is further configured to set an analog gain, wherein the electronic device further comprises:
   a digital-analog converter circuit configured to convert the digital output to an analog output, and wherein
   the electronic device decreases a signal level of the analog output based on the analog gain.

19. The electronic device of claim 18, wherein
a magnitude of the analog gain is same as a magnitude of the digital gain, and
a sign of the analog gain is opposite a sign of the digital gain.

20. The electronic device of claim 18, wherein the output gain controller circuit is further configured to set the analog gain such that, based on the analog gain, the electronic device decreases the signal level of the analog output by an amount that the peak level increases to reach the target level based on the digital gain.

* * * * *